United States Patent
Choi et al.

(10) Patent No.: US 9,911,688 B2
(45) Date of Patent: Mar. 6, 2018

(54) SEMICONDUCTOR CHIP, SEMICONDUCTOR PACKAGE INCLUDING THE SAME, AND METHOD OF FABRICATING THE SAME

(71) Applicant: Samsung Electronics Co., Ltd., Suwon-si (KR)

(72) Inventors: Kyo-Seon Choi, Hwaseong-si (KR); Seungmo Kang, Hwaseong-si (KR); Sang-ki Kim, Yongin-si (KR); Yooncheol Bang, Daegu (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/201,694

(22) Filed: Jul. 5, 2016

(65) Prior Publication Data

US 2017/0062321 A1 Mar. 2, 2017

(30) Foreign Application Priority Data

Aug. 26, 2015 (KR) ........................ 10-2015-0120342

(51) Int. Cl.
*H01L 21/00* (2006.01)
*H01L 23/498* (2006.01)
(Continued)

(52) U.S. Cl.
CPC .. *H01L 23/49838* (2013.01); *H01L 23/49822* (2013.01); *H01L 23/49827* (2013.01); *H01L 23/50* (2013.01); *H01L 23/544* (2013.01); *H01L 24/09* (2013.01); *H01L 23/3128* (2013.01); *H01L 2224/0235* (2013.01); *H01L 2224/02317* (2013.01); *H01L 2224/04042* (2013.01); *H01L 2224/06131* (2013.01); *H01L 2224/06135* (2013.01); *H01L 2224/32145* (2013.01); *H01L 2224/32225* (2013.01);
(Continued)

(58) Field of Classification Search
CPC ............. H01L 23/49838; H01L 23/544; H01L 23/49827; H01L 23/50
See application file for complete search history.

(56) References Cited

U.S. PATENT DOCUMENTS 6,030,890 A 2/2000 Iwabuchi
6,445,001 B2 9/2002 Yoshida
(Continued)

FOREIGN PATENT DOCUMENTS

JP 2010-186916 A 8/2010
JP 5244898 7/2013

Primary Examiner — Laura Menz
(74) Attorney, Agent, or Firm — Muir Patent Law, PLLC

(57) ABSTRACT

A semiconductor device includes a semiconductor chip substrate with a chip region and a scribe lane region, center and boundary pads respectively provided on the chip and scribe lane regions, a lower insulating structure provided on the chip region and the scribe lane region, a first conductive pattern including a contact portion, a conductive line portion, and a bonding pad portion, and an upper insulating structure defining first and second openings formed on the bonding pad portion and the boundary pad. The lower insulating structure includes a plurality of lower insulating layers, which are sequentially stacked on the substrate, and each of which is a silicon-containing inorganic layer.

20 Claims, 26 Drawing Sheets

(51) Int. Cl.
*H01L 23/544* (2006.01)
*H01L 23/00* (2006.01)
*H01L 23/50* (2006.01)
*H01L 23/31* (2006.01)

(52) U.S. Cl.
CPC ............ *H01L 2224/48091* (2013.01); *H01L 2224/48227* (2013.01); *H01L 2224/73265* (2013.01); *H01L 2225/0651* (2013.01); *H01L 2225/06527* (2013.01); *H01L 2225/06565* (2013.01); *H01L 2924/1436* (2013.01); *H01L 2924/15311* (2013.01)

(56) References Cited

U.S. PATENT DOCUMENTS

| | | | |
|---|---|---|---|
| 6,511,901 B1 | 1/2003 | Lam et al. | |
| 6,534,853 B2 | 3/2003 | Liu et al. | |
| 6,861,344 B2 * | 3/2005 | Yajima | H01L 22/34 257/E21.508 |
| 7,115,512 B2 | 10/2006 | Juengling et al. | |
| 7,915,065 B2 * | 3/2011 | Chen | B81B 7/0054 257/E21.575 |
| 7,947,978 B2 | 5/2011 | Lin et al. | |
| 8,004,095 B2 * | 8/2011 | Shim, II | H01L 21/568 257/774 |
| 8,435,868 B2 * | 5/2013 | Shigihara | H01L 21/6836 257/E21.214 |
| 8,629,481 B2 | 1/2014 | Nishimura et al. | |
| 8,704,336 B2 * | 4/2014 | He | H01L 22/32 257/620 |
| 8,735,276 B2 | 5/2014 | Chung et al. | |
| 8,957,503 B2 | 2/2015 | Yang et al. | |
| 9,006,891 B2 | 4/2015 | Liang et al. | |
| 9,263,394 B2 | 2/2016 | Uzoh et al. | |
| 9,583,456 B2 | 2/2017 | Uzoh et al. | |
| 9,698,088 B2 | 7/2017 | Kwon et al. | |
| 2006/0019480 A1 | 1/2006 | Cheng et al. | |
| 2008/0014735 A1 | 1/2008 | Chun et al. | |
| 2009/0026628 A1 | 1/2009 | Lee et al. | |
| 2009/0057842 A1 * | 3/2009 | He | H01L 22/32 257/620 |
| 2010/0187694 A1 | 7/2010 | Yu et al. | |
| 2010/0258937 A1 * | 10/2010 | Shim, II | H01L 21/568 257/692 |
| 2012/0280386 A1 | 11/2012 | Sato et al. | |
| 2012/0299197 A1 | 11/2012 | Kwon et al. | |
| 2013/0093087 A1 | 4/2013 | Chau et al. | |
| 2013/0154072 A1 | 6/2013 | Do et al. | |
| 2014/0035137 A1 | 2/2014 | Kwon et al. | |
| 2014/0203394 A1 | 7/2014 | Lin et al. | |
| 2014/0210087 A1 | 7/2014 | Kang | |
| 2014/0217619 A1 | 8/2014 | Zhao et al. | |
| 2015/0014844 A1 | 1/2015 | Wu et al. | |
| 2015/0014860 A1 * | 1/2015 | Jang | H01L 25/0657 257/774 |
| 2016/0254256 A1 | 9/2016 | Baek et al. | |
| 2017/0062321 A1 * | 3/2017 | Choi | H01L 23/49838 |
| 2017/0062363 A1 * | 3/2017 | Choi | H01L 24/05 |

* cited by examiner

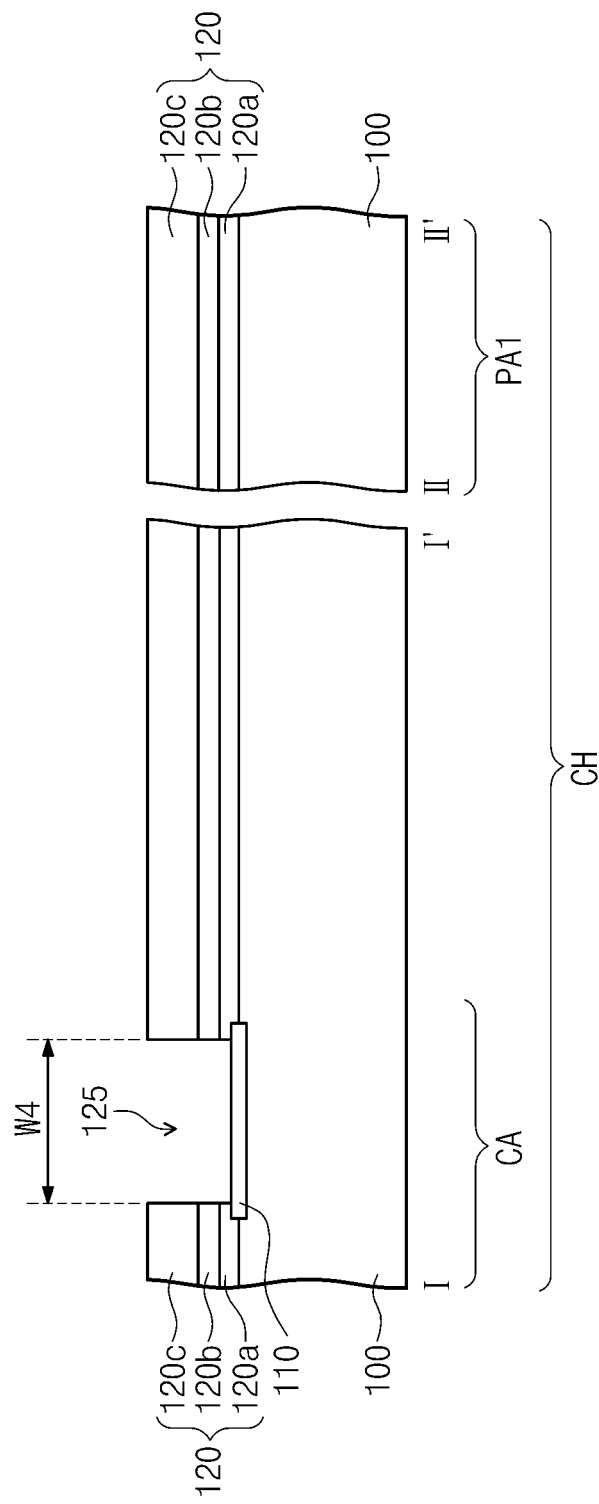

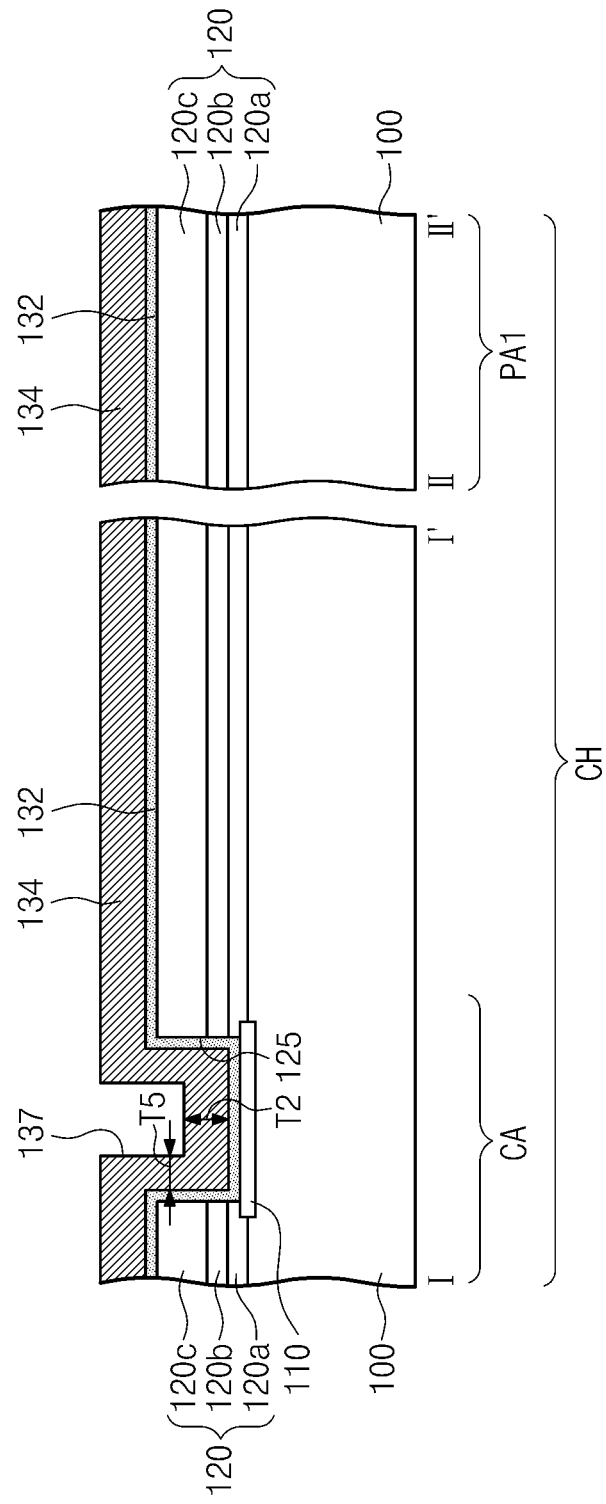

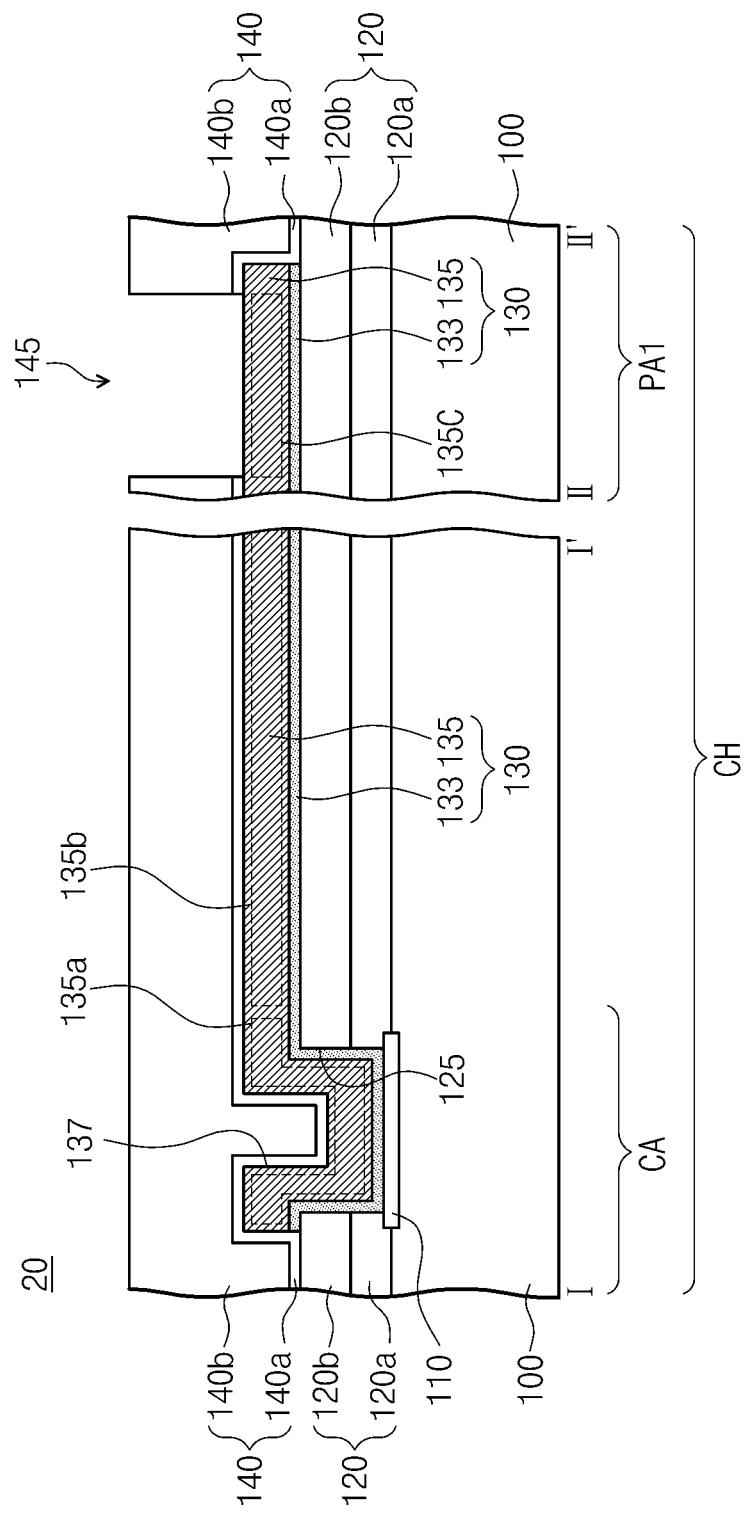

SEMICONDUCTOR CHIP, SEMICONDUCTOR PACKAGE INCLUDING THE SAME, AND METHOD OF FABRICATING THE SAME

CROSS-REFERENCE TO RELATED APPLICATIONS

This U.S. non-provisional patent application claims priority under 35 U.S.C. § 119 to Korean Patent Application No. 10-2015-0120342, filed on Aug. 26, 2015, in the Korean Intellectual Property Office, the entire contents of which are hereby incorporated by reference.

BACKGROUND

This disclosure relates to a semiconductor chip with a redistribution layer, a semiconductor package including the same, a method of fabricating the same.

Due to their small-size, multifunctionality, and/or low-cost characteristics, semiconductor devices are important elements in the electronic industry. Generally, semiconductor devices are classified into a memory device for storing data, a logic device for processing data, and a hybrid device for performing various functions.

As the electronic industry advances, there is an increasing demand for a semiconductor device with a higher integration density and higher performance. To meet such a demand, it is important to reduce a process margin (for example, in a photolithography process), but although a variety of studies are being conducted to solve the difficulties, the reduction of the process margin may lead to several difficulties in fabricating a semiconductor device.

In the meantime, various package technologies have been developed to meet demands for large capacity, thin thickness, and small size of semiconductor devices and/or electronic appliances. For example, a package technology of vertically stacking semiconductor chips has been used to allow an electronic product to have high density and large capacity features. The use of this package technology may allow many kinds of semiconductor chips to be integrated on a reduced area, when compared to a general package with a single semiconductor chip.

SUMMARY

Some embodiments of the inventive concept provide a semiconductor device such as a semiconductor chip with a redistribution layer formed using a deposition and patterning process.

Some embodiments of the inventive concept provide a method of fabricating a semiconductor device with a redistribution layer, using a deposition and patterning process.

Some embodiments of the inventive concept provide a semiconductor device such as a semiconductor package, in which a semiconductor chip with a redistribution layer is provided.

According to some embodiments of the inventive concept, a semiconductor device may include a semiconductor chip having a semiconductor substrate including a chip region and a scribe lane region, an integrated circuit being provided on the chip region, a center pad provided on the chip region and electrically connected to the integrated circuit, a boundary pad provided on the scribe lane region, a lower insulating structure provided on the chip region and the scribe lane region, the lower insulating structure having a first contact hole exposing the center pad, a first conductive pattern including a contact portion, a conductive line portion, and a bonding pad portion, the contact portion filling at least a portion of the first contact hole, the conductive line portion disposed on the lower insulating structure of the chip region to connect the contact portion to the bonding pad portion, and an upper insulating structure with a first opening and a second opening, the first opening exposing the bonding pad portion, the second opening vertically overlapping the boundary pad. The lower insulating structure may include a plurality of lower insulating layers, which are sequentially stacked on the semiconductor chip substrate, and each of which is a silicon-containing inorganic layer.

In some embodiments, the second opening may be formed to penetrate the lower insulating structure and to expose the boundary pad to an outside of the semiconductor chip.

In some embodiments, the semiconductor device may further include a second conductive pattern provided on the scribe lane region and electrically connected to the boundary pad. The second conductive pattern may be provided to fill at least a portion of a second contact hole, which is formed in the lower insulating structure to expose the boundary pad, and the second opening may be provided to expose the second conductive pattern.

In some embodiments, the first conductive pattern and the second conductive pattern may be formed of the same material.

In some embodiments, the lower insulating layers may include a first lower insulating layer adjacent to the center pad, a second lower insulating layer on the first lower insulating layer, and a third lower insulating layer on the second lower insulating layer. The second lower insulating layer may be interposed between the first and third lower insulating layers.

In some embodiments, each of the first and third lower insulating layers may include a silicon oxide layer, and the second lower insulating layer may include a silicon nitride layer.

In some embodiments, the third lower insulating layer may have a thickness greater than that of the first lower insulating layer, and the third lower insulating layer may have a thickness greater than that of the second lower insulating layer.

In some embodiments, the integrated circuit may include at least one dynamic random access memory (DRAM) cell.

In some embodiments, the semiconductor device may further include a barrier pattern interposed between the lower insulating structure and the first conductive pattern. The barrier pattern may overlap the first conductive pattern, when viewed in a plan view.

In some embodiments, the barrier pattern may include at least one of Ti, TiN, Ta, or TaN.

In some embodiments, the upper insulating structure may include an upper insulating layer covering the lower insulating structure and the first conductive pattern and a polymer layer on the upper insulating layer.

In some embodiments, the upper insulating layer may include a silicon nitride layer, a silicon oxide layer, or a silicon oxynitride layer.

In some embodiments, the polymer layer may include at least one of polyimide, fluoro carbon, resin, or synthetic rubber.

In some embodiments, the contact portion may have a first thickness in a direction perpendicular to a top surface of the semiconductor chip substrate and a second thickness in another direction parallel to the top surface of the semiconductor chip substrate, and the first thickness may be greater than the second thickness.

In some embodiments, the upper insulating structure may further include a third opening exposing the contact portion to an outside of the semiconductor chip.

In some embodiments, the center pad may be electrically connected to the integrated circuit through a plurality of metal layers and a plurality of vias.

In some embodiments, when viewed in a plan view, the center pad may be provided on a center area of the chip region, and the bonding pad portion may be provided on a peripheral area of the chip region.

In some embodiments, each of the first and second lower insulating structures may include a plurality of lower insulating layers, and each of the lower insulating layers may include one of a silicon nitride layer, a silicon oxide layer, or a silicon oxynitride layer.

In some embodiments, the conductive pattern may be formed of an aluminum-containing material.

In some embodiments, the boundary pad may be a cut pad having a size smaller than the center pad.

In some embodiments, the semiconductor device further includes a package substrate on which the semiconductor chip is mounted, and a wire connected to a pad on the package substrate, the wire passing over the scribe lane region including the boundary pad, and bonded to the bonding pad portion of the first conductive pad portion.

In some embodiments, the semiconductor device further includes one or more transistors and one or more metal layers below the boundary pad in the scribe lane region, the one or more transistors and one or more metal layers not electrically connected to the integrated circuit.

According to some embodiments of the inventive concept, a semiconductor device may include a package substrate, and at least one semiconductor chip mounted on the package substrate and electrically connected to the package substrate through a wire. Each semiconductor chip of the at least one semiconductor chip may include first and second surfaces facing each other, the first surface facing the package substrate, the second surface including a chip region and a boundary region enclosing the chip region, a lower insulating structure and an upper insulating structure sequentially stacked on the chip region and the boundary region, a center pad at least partly disposed below the lower insulating structure of the chip region, a boundary pad disposed at least in part a lower height than the lower insulating structure of the boundary region, and a first conductive pattern disposed on the chip region, interposed between the lower and upper insulating structures, and electrically connected to the center pad. The upper insulating structure may include an inorganic insulating layer, which contains silicon and covers the lower insulating structure and the first conductive pattern, and a polymer layer, which is disposed on the inorganic insulating layer.

In some embodiments, the boundary region may include a region serving as a scribe lane.

In some embodiments, the first conductive pattern may include a contact portion, a conductive line portion, and a bonding pad portion, the contact portion may be electrically connected to the center pad through the lower insulating structure, the conductive line portion may be disposed on the lower insulating structure to connect the contact portion to the bonding pad portion, the bonding pad portion may connect with the wire, and the upper insulating structure may have a first opening exposing the bonding pad portion.

In some embodiments, the boundary pad may be exposed to an outside of the semiconductor chip through a second opening sequentially penetrating the upper insulating structure and the lower insulating structure of the boundary region.

In some embodiments, the at least one semiconductor chip may further include a second conductive pattern disposed on the boundary region, interposed between the lower and upper insulating structures, and electrically connected to the boundary pad, and the second conductive pattern may be exposed to an outside of the semiconductor chip through a second opening penetrating the upper insulating structure of the boundary region.

In some embodiments, the at least one semiconductor chip may further include an integrated circuit electrically connected to the center pad, and the integrated circuit may be electrically connected to the package substrate through the center pad, the first conductive pattern, and the wire.

In some embodiments, the at least one semiconductor chip may include a plurality of semiconductor chips, which are sequentially stacked on the package substrate, and each of which is electrically connected to the package substrate through a respective bonding pad portion and the wire.

In some embodiments, the at least one semiconductor chip may further include a barrier pattern interposed between the lower insulating structure and the first conductive pattern, the first conductive pattern may include aluminum, and the barrier pattern may include at least one of Ti, TiN, Ta, or TaN.

In some embodiments, the lower insulating layers may include a first lower insulating layer adjacent to the center pad and the boundary pad, a second lower insulating layer adjacent to the upper insulating structure, and a third lower insulating layer interposed between the first and second lower insulating layers.

According to some embodiments, a semiconductor device includes a package substrate and a semiconductor chip. The semiconductor chip includes a semiconductor substrate and is mounted on the package substrate. The semiconductor chip further includes a chip region having a center region and a peripheral region outside of the center region. The chip region includes an integrated circuit, a center pad in the center region and electrically connected to the integrated circuit, and a redistribution line electrically connected to the center pad and including a contact portion contacting the center pad, a bonding pad portion in the peripheral region, and a conductive line portion connecting between the contact portion and the bonding pad portion. The semiconductor chip further includes a scribe lane region outside of the chip region, a boundary pad provided on the scribe lane region at the same vertical level as the center pad, wherein the boundary pad disposed above circuit components in the scribe lane region, and an insulating structure formed between the semiconductor substrate and the redistribution line and contacting the redistribution line. The insulating structure is provided to have a recess region formed in an upper portion thereof. When viewed in a plan view, the recess region does not overlap the redistribution line.

According to some embodiments, the boundary pad is smaller than the center pad.

In some embodiments, the insulating structure is formed between the semiconductor substrate and the redistribution line and contacting the redistribution line, wherein the insulating structure is formed of an inorganic material, and the redistribution line is formed of aluminum.

According to some embodiments of the inventive concept, a method of fabricating a semiconductor chip may include providing a substrate with a chip region and a scribe lane region enclosing the chip region, forming a center pad and a boundary pad on the chip region and the scribe lane region, respectively, forming a lower insulating structure on the substrate to cover the center pad and the boundary pad, patterning the lower insulating structure to form a first contact hole exposing the center pad, forming a conductive layer on the lower insulating structure to fill at least a portion of the first contact hole, patterning the conductive layer to form a first conductive pattern, the first conductive pattern extending in a direction on the lower insulating structure of the chip region and including a bonding pad portion, forming an upper insulating structure on the lower insulating structure, and patterning the upper insulating structure to form a first opening exposing the bonding pad portion and a second opening vertically overlapping the boundary pad.

In some embodiments, the patterning of the conductive layer may include removing the conductive layer from the scribe lane region, the method may further include etching the lower insulating structure through the second opening to expose the boundary pad, after the patterning of the upper insulating structure.

In some embodiments, the patterning of the lower insulating structure may include forming a second contact hole to expose the boundary pad, the patterning of the conductive layer may include forming a second conductive pattern, which fills at least a portion of the second contact hole and may be electrically connected to the boundary pad, and the second opening may be formed to expose the second conductive pattern.

In some embodiments, the method may further include cutting the substrate in a direction crossing the boundary pad, after the forming of the second opening.

In some embodiments, the method may further include forming a barrier layer on the lower insulating structure, before the forming of the conductive layer, and then patterning both of the conductive layer and the barrier layer to form a barrier pattern, which is overlapped with the first conductive pattern when viewed in a plan view.

In some embodiments, the forming of the conductive layer may be performed using a physical vapor deposition process.

In some embodiments, the conductive layer in the first contact hole may have a first thickness in a direction perpendicular to a top surface of the substrate and a second thickness in another direction parallel to the top surface of the substrate, and the first thickness may be greater than the second thickness.

In some embodiments, the conductive layer may be formed to contain aluminum. The patterning of the conductive layer may include forming a photoresist pattern on the conductive layer, and performing a dry etching process using the photoresist pattern as an etch mask, on the conductive layer.

In some embodiments, the forming of the upper insulating structure may include forming an upper insulating layer and a polymer layer on the upper insulating layer, and the upper insulating layer may include a silicon nitride layer, a silicon oxide layer, or a silicon oxynitride layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 6A through 11A are sectional views taken along lines I-I' and II-II' of FIG. 2 to illustrate a method of fabricating a first semiconductor chip, according to some embodiments of the inventive concept.

FIGS. 6B through 11B are sectional views taken along line III-III' of FIG. 2 to illustrate a method of fabricating a first semiconductor chip, according to some embodiments of the inventive concept.

FIG. 19A is a sectional view of sections, which are respectively taken along lines I-I' and II-II' of FIG. 2, and illustrates a first semiconductor chip according to some embodiments of the inventive concept.

Figure 1:
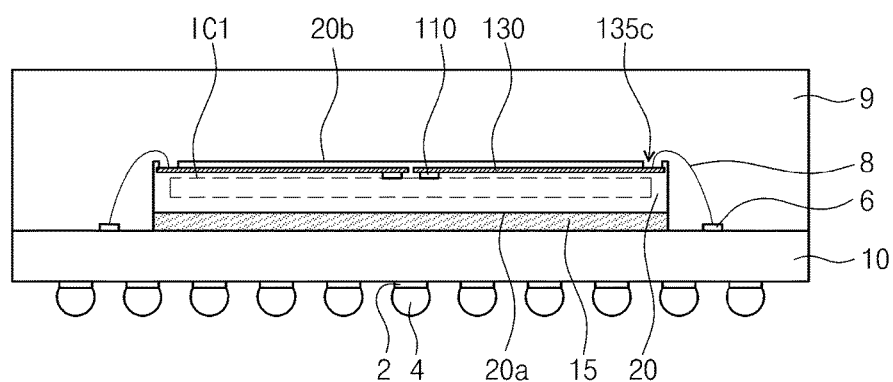
FIG. 1 is a sectional view illustrating a semiconductor package according to some embodiments of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as limiting the range of values or properties encompassed by example embodiments. For example, the relative thicknesses and positioning of molecules, layers, regions and/or structural elements may be reduced or exaggerated for clarity.

Though the different figures show variations of exemplary embodiments, these figures are not necessarily intended to be mutually exclusive from each other. Rather, as will be seen from the context of the detailed description below, certain features depicted and described in different figures can be combined with other features from other figures to result in various embodiments, when taking the figures and their description as a whole into consideration.

The use of similar or identical reference numbers in the various drawings is intended to indicate the presence of a similar or identical element or feature.

DETAILED DESCRIPTION

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein.

It will be understood that when an element is referred to as being "connected" or "coupled" to another element, it can be directly connected or coupled to the other element or intervening elements may be present. In contrast, when an element is referred to as being "directly connected" or "directly coupled" to another element, or as "contacting" or "in contact with" another element, there are no intervening elements present. Other words used to describe the relationship between elements or layers should be interpreted in a like fashion (e.g., "between" versus "directly between," "adjacent" versus "directly adjacent," "on" versus "directly on"). As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. Unless the context indicates otherwise, these terms are only used to distinguish one element, component, region, layer or section from another element, component, region, layer or section, for example as a naming convention. Thus, a first element, component, region, layer or section discussed below in one section of the specification could be termed a second element, component, region, layer or section in another section of the specification or in the claims without departing from the teachings of the present invention. In addition, in certain cases, even if a term is not described using "first," "second," etc., in the specification, it may still be referred to as "first" or "second" in a claim in order to distinguish different claimed elements from each other.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, are open terms that specify the presence of stated features, integers, steps, operations, elements and/or components, but do not preclude the presence or addition of one or more other features, integers, steps, operations, elements, components and/or groups thereof. The term "consists of" is a closed term used to indicate a closed group of items.

Terms such as "same," "equal," "planar," or "coplanar," as used herein when referring to orientation, layout, location, shapes, sizes, amounts, or other measures do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, unless the context indicates otherwise, levels described as the same level, or widths described as equal widths herein may be at substantially the same level or may have substantially equal widths, or may be at exactly the same level or have exactly the same widths. The terms "exactly" or "identically" used in conjunction with "same" or "equal" indicate no variation in the described feature.

Terms such as "about" or "approximately" may reflect amounts, sizes, orientations, or layouts that vary only in a small relative manner, and/or in a way that does not significantly alter the operation, functionality, or structure of certain elements. For example, a range from "about 0.1 to about 1" may encompass a range such as a 0%-5% deviation around 0.1 and a 0% to 5% deviation around 1, especially if such deviation maintains the same effect as the listed range.

As used herein, items described as being "electrically connected" are configured such that an electrical signal can be passed from one item to the other. Therefore, a passive electrically conductive component (e.g., a wire, pad, internal electrical line, etc.) physically connected to a passive electrically insulative component (e.g., a prepreg layer of a printed circuit board, an electrically insulative adhesive connecting two device, an electrically insulative underfill or mold layer, etc.) is not electrically connected to that component. Moreover, items that are "directly electrically connected," to each other are electrically connected through one or more passive elements, such as, for example, wires, pads, internal electrical lines, through vias, etc. As such, directly electrically connected components do not include components electrically connected through active elements, such as transistors or diodes. Directly electrically connected elements may be directly physically connected and directly electrically connected.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

As used herein, a semiconductor device may refer to a device such as a semiconductor chip (e.g., memory chip and/or logic chip formed on a die), a stack of semiconductor chips, a semiconductor package including one or more semiconductor chips stacked on a package substrate, or a package-on-package device including a plurality of packages. These devices may be formed using ball grid arrays, wire bonding, through substrate vias, or other electrical connection elements, and may include memory devices such as volatile or non-volatile memory devices.

An electronic device, as used herein, may refer to these semiconductor devices, but may additionally include products that include these devices, such as a memory module, memory card, hard drive including additional components, or a mobile phone, laptop, tablet, desktop, camera, or other consumer electronic device, etc.

Figure 2:
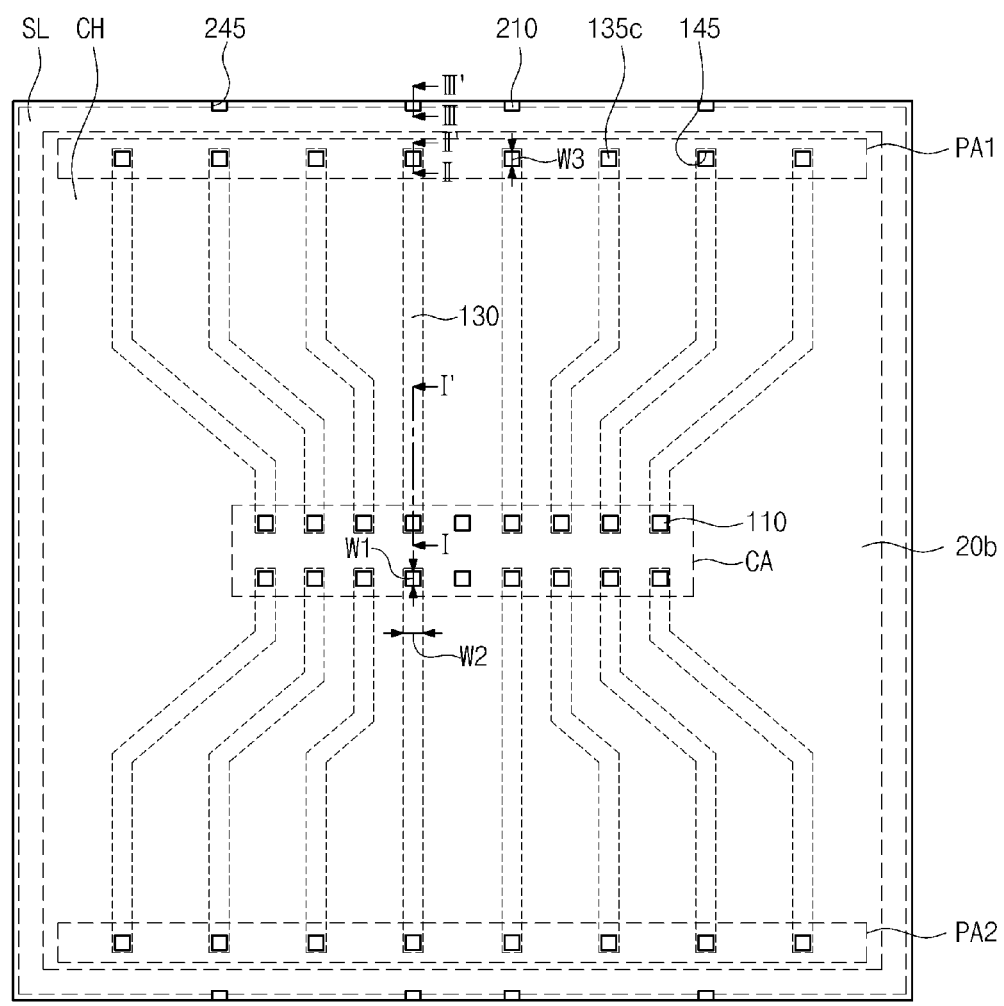
FIG. 2 is a plan view schematically illustrating a second surface of a first semiconductor chip according to some embodiments of the inventive concept.

FIG. 1 is a sectional view illustrating a semiconductor package according to some embodiments of the inventive concept. FIG. 2 is a plan view schematically illustrating a second surface of a first semiconductor chip according to some embodiments of the inventive concept.

Referring to FIGS. 1 and 2, a first semiconductor chip 20 may be mounted on a package substrate 10. As an example, the package substrate 10 may be a printed circuit board (PCB). The package substrate 10 may include circuit patterns (not shown) provided on one or both of top and bottom surfaces thereof. At least one of the circuit patterns may be electrically connected to first outer pads 2, which may be provided on the bottom surface of the package substrate 10. Outer terminals 4 (e.g., solder bumps or solder balls) may be respectively attached on the first outer pads 2 to electrically connect the package substrate 10 to an external device. As the first outer pads 2 and outer terminals 4 are used to attach and connect to an external device, these pads and terminals may be referred to as external terminals. At least one other of the circuit patterns may be electrically connected to second outer pads 6, which may be provided on the top surface of the package substrate 10. As the second outer pads 6 may be used to connect to a device such as first semiconductor chip 20 internal to the semiconductor package, these pads may be referred to as internal pads.

It should be noted that the term "terminal" can be used generally to refer to a conductive component arranged to electrically connect to another component. For example, a combined outer pad 2 and outer terminal 4 may be referred to generally together as an external terminal. The term "pad" generally refers to a conductive terminal having a flat surface profile, and often formed in a layer deposition and patterning process, and which typically connects to internal circuitry (e.g., an integrated circuit) or conductive lines of substrate or semiconductor chip.

The first semiconductor chip 20 may have a first surface 20a facing the package substrate 10 and a second surface 20b facing the first surface 20a. The first semiconductor chip 20 may include a center area CA and first and second peripheral areas PA1 and PA2. The center area CA may be positioned at a region including a center of the second surface 20b of the first semiconductor chip 20. The first and second peripheral areas PA1 and PA2 may be positioned adjacent to opposite sidewalls, respectively, of the first semiconductor chip 20. The center area CA may be disposed between the first and second peripheral areas PA1 and PA2. It should be noted that other arrangements may be used. For example, in addition to first and second peripheral areas PA1 and PA2, additional third and/or fourth peripheral areas adjacent to other sidewalls of the first semiconductor chip 20 may be included. An another example, rather than a rectangular-shaped center area having pads arranged in a two rows and a rectangular shape, other configurations, such as more than two rows and/or a square shape or less elongated rectangular shape may be formed.

The first semiconductor chip 20 may include a first integrated circuit IC1, center pads 110, and redistribution layers 130. The first integrated circuit IC1 may be provided in a portion of the first semiconductor chip 20 positioned adjacent to the second surface 20b. The center pads 110 may be electrically connected to the first integrated circuit IC1. When viewed in a plan view, the center pads 110 may be disposed on the center area CA.

The redistribution layers 130 may be disposed on the center pads 110 (e.g., above the center pads 110 such that the center pads 110 are vertically between the first integrated circuit IC1 and the redistribution layers 130). The redistribution layers 130 may include bonding pad portions 135c. The bonding pad portions 135c may be electrically connected to the first integrated circuit IC1 via the center pads 110. The bonding pad portions 135c may be provided on the first and second peripheral areas PA1 and PA2. The bonding pad portions 135c may be exposed to the outside of the first semiconductor chip 20. The redistribution layers 130 may be configured to allow signals from the first and second peripheral areas PA1 and PA2 to be applied to the center pads 110 of the center area CA through the bonding pad portions 135c. The bonding pad portions 135c may function as bonding pads, and may be referred to herein as bonding pads when being described in connection with other adjacent conductive components.

The disclosed embodiments are not limited to the illustrated example of the center pads 110 and the redistribution layers 130, and embodiments of the inventive concept may be variously changed in consideration of a type or use of a semiconductor package.

The first semiconductor chip 20 may be one of memory chips (e.g., DRAM chips or FLASH memory chips). For example, it may be a top chip or other chip in a stack of chips stacked on the package substrate 10. The first integrated circuit IC1 may include memory cells for storing data and a control and/or power circuit for controlling operations of the memory cells.

The first semiconductor chip 20 may be attached to the package substrate 10 using a first adhesive layer 15. For example, the first adhesive layer 15 may be an insulating layer or tape (e.g., containing an epoxy or silicone-based material).

Wires 8 may be provided to electrically connect the bonding pad portions 135c of the first semiconductor chip 20 to the second outer pads 6 of the package substrate 10, respectively. The first semiconductor chip 20 may communicate with an external controller (not shown) through the wires 8. The wires 8 may be used to transmit various data, such as control signals containing address and command data, voltage signals, and any other data, to the first semiconductor chip 20 from the controller. Also, the wires 8 may be used to transmit data, which are read out from the memory cells of the first semiconductor chip 20, to the controller.

A mold layer 9 may be provided on the package substrate 10 to cover the first semiconductor chip 20 and the wires 8. The mold layer 9 may be configured to protect the first semiconductor chip 20 and the wires 8 against external environment. The mold layer 9 may include, for example, an epoxy molding compound material.

Figure 3A:
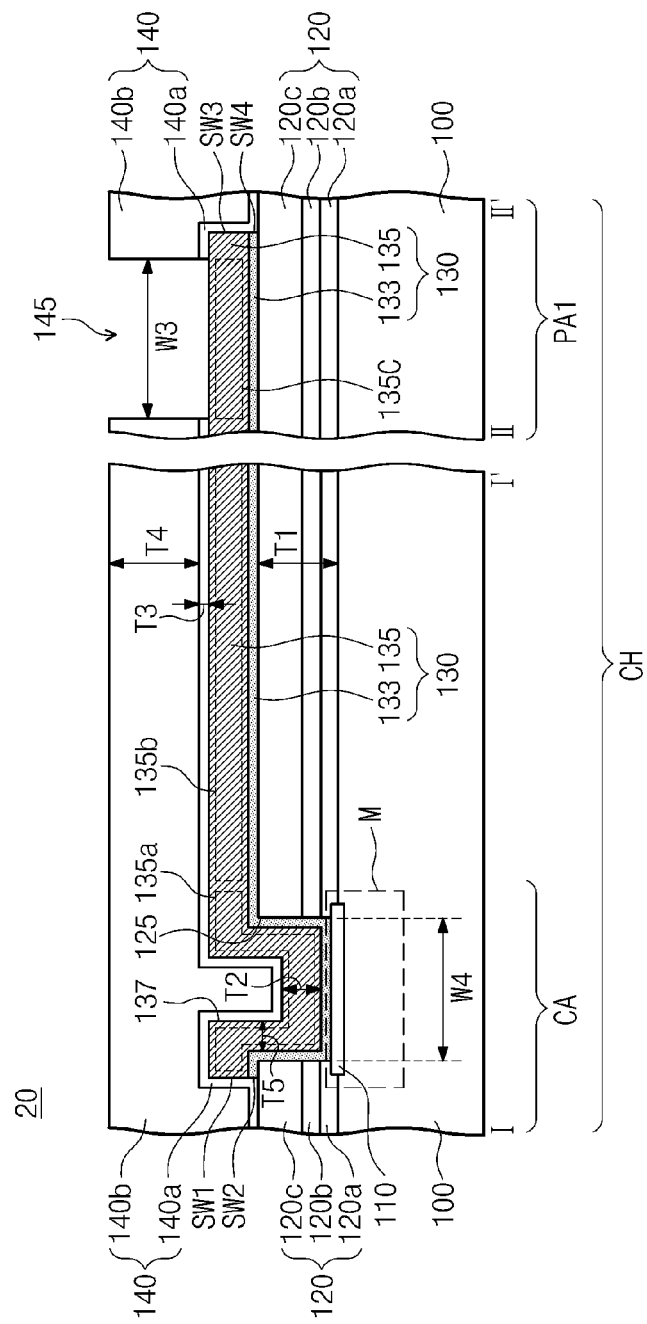
FIG. 3A is a sectional view of sections, which are respectively taken along lines I-I' and II-II' of FIG. 2, and illustrates a first semiconductor chip according to some embodiments of the inventive concept.
Figure 3B:
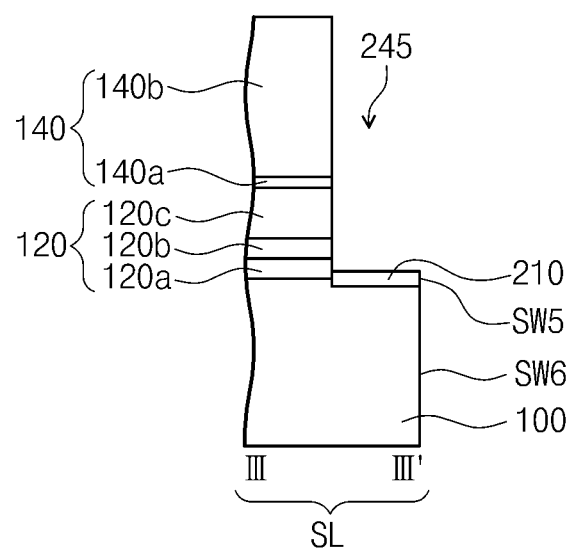
FIG. 3B is a sectional view taken along line III-III' of FIG. 2 and illustrates the first semiconductor chip according to some embodiments of the inventive concept.
Figure 4:
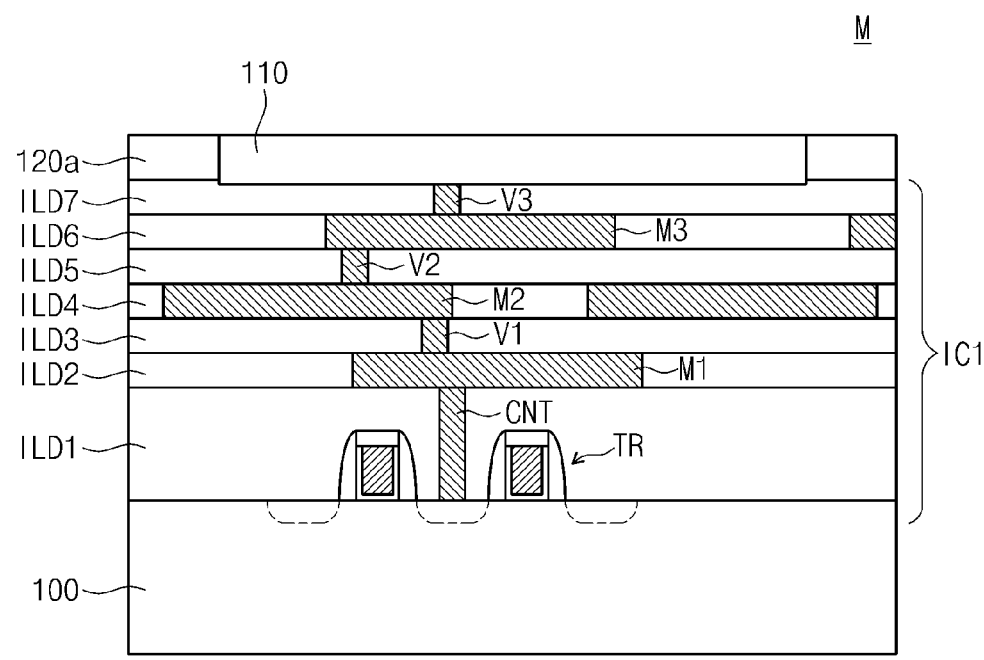
FIG. 4 is an enlarged sectional view of a region M of FIG. 3.

FIG. 3A is a sectional view of sections, which are respectively taken along lines I-I' and II-II' of FIG. 2, and illustrates a first semiconductor chip according to some embodiments of the inventive concept. FIG. 3B is a sectional view taken along line III-III' of FIG. 2 and illustrates the first semiconductor chip according to some embodiments of the inventive concept. FIG. 4 is an enlarged sectional view of a region M of FIG. 3A. In the following description, the first semiconductor chip 20 will be described in more detail, without repeating an overlapping description of the semiconductor package previously described with reference to FIGS. 1 and 2.

Referring to FIGS. 2, 3A, 3B, and 4, a semiconductor substrate 100, also referred to herein as a semiconductor chip substrate, with a chip region CH and a boundary region SL may be provided. The boundary region SL may be provided to enclose the chip region CH. As an example, the chip region CH and the boundary region SL may be defined on the second surface 20b of the first semiconductor chip 20. The chip region CH may include the center area CA and the first and second peripheral areas PA1 and PA2. In some embodiments, the boundary region SL may be a scribe lane, for example interposed between the chip or die regions of a semiconductor wafer that includes a plurality of chips and included in the first semiconductor chip 20 after a cutting process. The semiconductor substrate 100 may be, for example, a silicon wafer, a germanium wafer, or a silicon-germanium wafer.

The center pads 110 may be provided on the center area CA of the chip region CH. The center pads 110 may be arranged to form two columns within the center area CA, but the inventive concept is not limited thereto. The center pads 110 may be formed of or include a conductive material (e.g., aluminum (Al)). At least one of the center pads 110 may have a first width W1, when measured in a first direction D1 parallel to a top surface of the semiconductor substrate 100. In some embodiments, the first width W1 may be an amount in the range from 5 µm to 50 µm.

Boundary pads 210 may be provided on the boundary region SL. As an example, the boundary pads 210 may be provided to extend to and be in contact with an edge of the first semiconductor chip 20. The boundary pads 210 may be formed of or include a conductive material (e.g., aluminum (Al)). In some embodiments, the conductive material forming the boundary pads 210 is the same conductive material forming the center pads 110. The inventive concept is not limited to the number and arrangement of the boundary pads 210 illustrated in the afore-described example. Hereinafter, one of the center pads 110 and one of the boundary pads 210 will be exemplarily described, for concise description.

The center pad 110 may be electrically connected to the first integrated circuit IC1 in the first semiconductor chip 20. Referring back to FIG. 4, the first integrated circuit IC1 may be disposed on the semiconductor substrate 100. The first integrated circuit IC1 may include a plurality of transistors TR, a plurality of metal layers M1-M3, and a plurality of vias V1-V3.

Each of the transistors TR may include a gate electrode and impurity regions provided at both side of the gate electrode. The impurity regions may be doped regions, which may be formed by injecting impurities into the semiconductor substrate 100. Each of the transistors TR may be used as a part of the memory cells or as a part of the control and/or power circuit for controlling operations of the memory cells.

First to seventh interlayered insulating layers ILD1-ILD7 may be sequentially stacked on the semiconductor substrate 100. The first interlayered insulating layer ILD1 may be provided to cover the transistors TR. A contact CNT (e.g., a through-via) may be provided to pass through the first interlayered insulating layer ILD1 and may be connected to one of the impurity regions of the transistors TR.

A first metal layer M1, a second metal layer M2, and a third metal layer M3 may be provided in the second interlayered insulating layer ILD2, the fourth interlayered insulating layer ILD4, and the sixth interlayered insulating layer ILD6, respectively. The center pad 110 may be provided on the seventh interlayered insulating layer ILD7. A first via V1 may be provided between the first and second metal layers M1 and M2, a second via V2 may be provided between the second and third metal layers M2 and M3, and a third via V3 may be provided between the third metal layer M3 and the center pad 110. The center pad 110 may be electrically connected to the transistors TR through the metal layers (M1-M3) and the vias V1-V3.

Although not shown, the boundary pad 210 may be electrically connected to boundary metal layers and boundary transistors, which are provided below the boundary region SL. At least one of the boundary metal layers may be formed using a process of forming at least one of the plurality of metal layers M1-M3. At least one of the boundary transistors may be formed using a process of forming at least one of the transistors TR.

Referring back to FIGS. 2, 3A, and 3B, a lower insulating structure 120 may be disposed on a top surface of the semiconductor substrate 100. The lower insulating structure 120 may cover a portion of the center pad 110 on the chip region CH. The center pad 110 may therefore be located below the lower insulating structure 120. The lower insulating structure 120 may be at a higher vertical level than a portion of the boundary pad 210 on the boundary region SL. The lower insulating structure 120 may have a first thickness T1. As an example, the first thickness T1 may range from 1 µm to 12 µm. A top surface of the lower insulating structure 120 of the chip region CH may be positioned at substantially the same level as that of the lower insulating structure 120 of the boundary region SL.

A first contact hole 125 may be provided to penetrate the lower insulating structure 120 and expose the remaining portion of the center pad 110. The first contact hole 125 may have a fourth width W4 in the first direction D1. The fourth width W4 may be smaller than the first width W1. For example, the fourth width W4 may range from 5 µm to 50 µm.

A second opening 245 may be provided to penetrate the lower insulating structure 120 and expose the remaining portion of the boundary pad 210. For example, as shown in FIG. 2, a plurality of second openings 245 may be provided on the boundary region SL to expose the boundary pads 210, respectively. As an example, the boundary pad 210 exposed by the second opening 245 may have a fifth sidewall SW5. The semiconductor substrate 100 may have a sixth sidewall SW6 adjacent to the second opening 245. In some embodiments, the fifth sidewall SW5 may be aligned to the sixth sidewall SW6 (e.g., vertically aligned to be coplanar with the sixth sidewall SW6).

The lower insulating structure 120 may include first to third lower insulating layers 120a, 120b, and 120c, which may be sequentially stacked on the semiconductor substrate 100. For example, the second lower insulating layer 120b may be interposed between the first and third lower insulating layers 120a and 120c. Here, the third lower insulating layer 120c may have a thickness greater than that of the first lower insulating layer 120a and/or that of the second lower insulating layer 120b.

In some embodiments, a top surface of the first lower insulating layer 120a of the chip region CH may be positioned at substantially the same level as a top surface of the first lower insulating layer 120a of the boundary region SL.

A top surface of the second lower insulating layer 120b of the chip region CH may be positioned at substantially the same level as a top surface of the second lower insulating layer 120b of the boundary region SL.

According to certain embodiments, each of the first to third lower insulating layers 120a, 120b, and 120c may be formed of or include an inorganic insulating layer (e.g., of silicon nitride, silicon oxide, or silicon oxynitride). For example, the first lower insulating layer 120a may be formed of or include a silicon oxide layer, the second lower insulating layer 120b may be formed of or include a silicon nitride layer, and the third lower insulating layer 120c may be formed of or include a silicon oxide layer. The first insulating layer 120a may be formed simultaneously in the center area (e.g., CA), peripheral areas (e.g., PA1 and PA2), and boundary region (e.g., SL). Similarly each of the second and third insulating layers 120b and 120c may be formed simultaneously in the center area (e.g., CA), peripheral areas (e.g., PA1 and PA2), and boundary region (e.g., SL). In one embodiment, the first semiconductor chip 20 may be a DRAM chip.

In the case where a first conductive pattern 135 is formed by a subsequent plating process, the lower insulating structure 120 may include a polymer layer (e.g., of polyimide), because there is a difficulty to perform a metal plating process on an inorganic insulating layer. However, according to some embodiments of the inventive concept, the first conductive pattern 135 may be formed by a deposition and patterning process, and thus, it is possible to use an inorganic insulating material for the lower insulating structure 120.

The redistribution layer 130 may be provided on the lower insulating structure 120 to fill at least a portion of the first contact hole 125 and be electrically connected to the center pad 110. In some embodiments, as shown in FIG. 2, a plurality of redistribution layers 130 may be provided on the lower insulating structure 120. When viewed in a plan view, each of the redistribution layers 130 may be a line-shaped structure extending from the center pads 110 toward the first direction D1. Some of the redistribution layers 130 may extend in opposite directions from each other. For example, the redistribution layers 130 may extend from the center area CA to the first peripheral area PA1 or from the center area CA to the second peripheral area PA2. At least one of the redistribution layers 130 may include a portion extending in a direction other than the first direction D1 (e.g., a diagonal direction or a direction crossing the first direction D1). In some embodiments, the redistribution layers 130 may be disposed to have end portions that are uniformly arranged on the first and second peripheral areas PA1 and PA2. The redistribution layers, also referred to individually as redistribution lines, each include at least a first conductive pattern (e.g., 135) arranged to electrically connect between a first pad (e.g., a pad such as a center pad 110 at the center area CA) and a second area (e.g., a peripheral area PA1 or PA2).

At least one of the redistribution layers 130 may have a second width W2, when measured in a second direction D2 crossing the first direction D1. The second direction D2 may be parallel to the top surface of the semiconductor substrate 100. As an example, each of the redistribution layers 130 may serve as a signal line, a power line, or a ground line. In some embodiments, a width of each of the redistribution layers 130 may be dependent on its assigned function. For example, the second width W2 may range from 2 μm to 200 μm.

The redistribution layer 130 may include a first barrier pattern 133 and a first conductive pattern 135 on the first barrier pattern 133. The first barrier pattern 133 may be interposed between the lower insulating structure 120 and the first conductive pattern 135. The first barrier pattern 133 may be overlapped with the first conductive pattern 135, when viewed in a plan view. The first barrier pattern 133 may be provided to prevent metallic elements from being diffused from the first conductive pattern 135 to the lower insulating structure 120, and for example, may be formed of or include at least one of Ti, TiN, Ta, or TaN. In addition, the first barrier pattern 133 may be configured to have a good wetting property with respect to the lower insulating structure 120 thereunder.

The first conductive pattern 135 may include a contact portion 135a filling the first contact hole 125, a conductive line portion 135b extending in the first direction D1 on the lower insulating structure 120, and a bonding pad portion 135c. The contact portion 135a, the conductive line portion 135b, and the bonding pad portion 135c may be connected to form a single body (e.g., the first conductive pattern 135). For example, the contact portion 135a, the conductive line portion 135b, and the bonding pad portion 135c may be a continuous structure formed without spaces or boundaries therebetween.

The contact portion 135a may have a second thickness T2, when measured in a direction perpendicular to the top surface of the semiconductor substrate 100 (e.g., for horizontally oriented portions). In addition, the contact portion 135a in the first contact hole 125 may have a fifth thickness T5, when measured in the first direction D1 or the second direction D2 (e.g., for vertically-oriented portions). In certain embodiments, the second thickness T2 may be greater than the fifth thickness T5. For example, the second thickness T2 may range from 1 μm to 8 μm. The contact portion 135a filling the first contact hole 125 may be provided to define a recess region 137.

The conductive line portion 135b may be positioned between the contact portion 135a and the bonding pad portion 135c. Similar to the redistribution layers 130 previously described with reference to FIG. 2, the conductive line portion 135b may be a line-shaped structure extending in the first direction D1. The line-shaped structures may have bent portions such as shown in FIG. 2, for example, wherein certain portions of each line extend in the first direction D1 and other portions of each line extend in a different (e.g., angled) direction. The conductive line portion 135b may be provided to allow the bonding pad portion 135c on the first peripheral area PA1 to be electrically connected to the contact portion 135a on the center area CA.

An end portion of the contact portion 135a may have a first sidewall SW1. An end portion of the first barrier pattern 133 adjacent to the contact portion 135a may have a second sidewall SW2. Here, the first and second sidewalls SW1 and SW2 may be vertically aligned with each other, when viewed in a plan view or cross-sectional view. An end portion of the bonding pad portion 135c may have a third sidewall SW3. Other end portion of the first barrier pattern 133 adjacent to the bonding pad portion 135c may have a fourth sidewall SW4. Here, the third and fourth sidewalls SW3 and SW4 may be vertically aligned with each other, when viewed in a plan or cross-sectional view.

The first conductive pattern 135 may include a metallic material, on which a deposition and patterning process can be effectively performed. As an example, the first conductive pattern 135 may be formed of an aluminum-containing material.

An upper insulating structure 140 may be provided on the redistribution layer 130 and the lower insulating structure 120. The upper insulating structure 140 may include an upper insulating layer 140a and a polymer layer 140b, which may be sequentially stacked on the semiconductor substrate 100. The upper insulating layer 140a may be provided to directly cover the redistribution layer 130. As an example, the upper insulating layer 140a may directly cover the first and third sidewalls SW1 and SW3 of the first conductive pattern 135 and the second and fourth sidewalls SW2 and SW4 of the first barrier pattern 133. The polymer layer 140b may be spaced apart from the redistribution layer 130 with the upper insulating layer 140a interposed therebetween. The upper insulating layer 140a may be conformally formed on the redistribution layer 130, other than a portion where it is removed (e.g., on the bonding portion 135c of the redistribution layer 130).

The top surface of the upper insulating structure 140 of the chip region CH may be positioned at substantially the same level as the top surface of the upper insulating structure 140 of the boundary region SL. The upper insulating structure 140 may be provided to protect the redistribution layer 130 against external environment and to prevent a short circuit from being formed between the redistribution layers 130.

A first opening 145 may be provided to penetrate the first upper insulating structure 140 and to expose the bonding pad portion 135c. For example, as shown in FIG. 2, a plurality of first openings 145 may be provided on the first and second peripheral areas PA1 and PA2 to expose the bonding pad portions 135c, respectively.

The first opening 145 may have the third width W3 in the first direction D1. The third width W3 may be greater than the fourth width W4. In some embodiments, the third width W3 may be a width sufficient to allow the wire bonding process to be easily performed on the bonding pad portion 135c. For example, the third width W3 may range from 100 μm to 300 μm.

The second opening 245 exposing the boundary pad 210 may be formed to penetrate not only the lower insulating structure 120 but also the upper insulating structure 140. Accordingly, the boundary pad 210 may be completely exposed to the outside of the first semiconductor chip 20 through the second opening 245.

In some embodiments, the upper insulating layer 140a may include a silicon-containing inorganic insulating layer (e.g., a silicon nitride layer, a silicon oxide layer, or a silicon oxynitride layer). By contrast, the polymer layer 140b may be formed of or include an organic insulating layer (e.g., at least one of polyimide, fluoro carbon, resin, or synthetic rubber). The upper insulating layer 140a may have a third thickness T3, and the polymer layer 140b may have a fourth thickness T4. Here, the fourth thickness T4 may be greater than the third thickness T3, for example, when measured in the same vertical direction at a particular horizontal location. As an example, the third thickness T3 may range from 0.1 μm to 3 μm, and the fourth thickness T4 may range from 0.3 μm to 6 μm.

In the case where the redistribution layer 130 is formed using a plating process, the boundary region SL (e.g., a scribe lane region) may be directly exposed, without an insulating layer. By contrast, in semiconductor chips according to some embodiments of the inventive concept, the redistribution layer 130 may be formed by a deposition and patterning process, and thus, an insulating structure may be provided on the boundary region SL.

Figure 5:
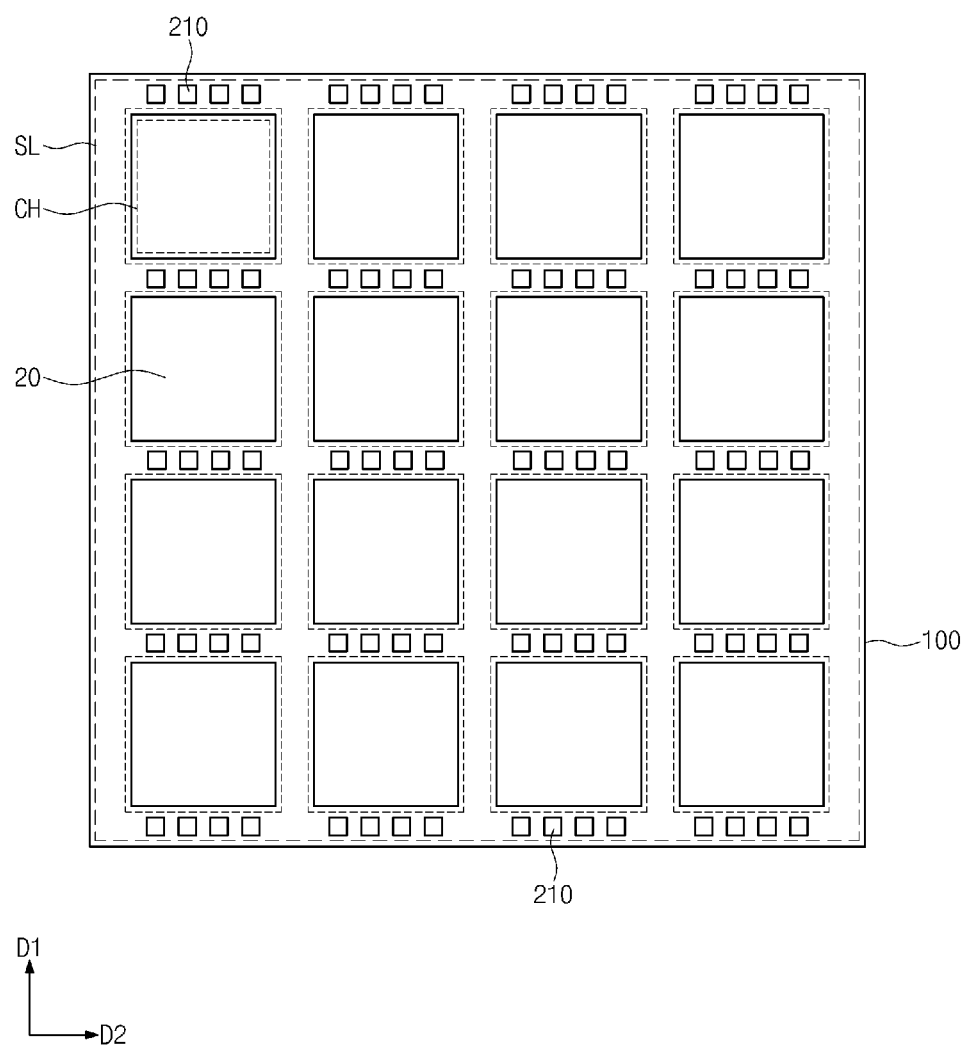
FIG. 5 is a plan view schematically illustrating a semiconductor substrate, before performing a cutting process on first semiconductor chips.

FIG. 5 is a plan view schematically illustrating a semiconductor substrate, before performing a cutting process on first semiconductor chips. FIGS. 6A through 11A are sectional views taken along lines I-I' and II-II' of FIG. 2 to illustrate a method of fabricating a first semiconductor chip, according to some embodiments of the inventive concept. FIGS. 6B through 11B are sectional views taken along line III-III' of FIG. 2 to illustrate a method of fabricating a first semiconductor chip, according to some embodiments of the inventive concept.

Referring to FIGS. 2, 5, 6A, and 6B, the semiconductor substrate 100 with the chip regions CH and the boundary regions SL may be provided. In some embodiments, each boundary region SL may be a scribe lane interposed between the chip or die regions. The first integrated circuit IC1 may be formed on the chip region CH of the semiconductor substrate 100. The first integrated circuit IC1 may include a plurality of transistors TR, a plurality of metal layers M1-M3, and a plurality of vias V1-V3, and in some embodiments, it may be configured to have substantially the same features as that described with reference to FIG. 4.

The center pads 110 may be formed on the center area CA of the chip region CH. The center pads 110 may be electrically connected to the first integrated circuit IC1. The boundary pads 210 may be formed on the boundary region SL. The boundary pads 210 may be electrically connected to boundary metal layers and boundary transistors, which are provided below the boundary pads 210 in the boundary regions SL. Hereinafter, one of the center pads 110 and one of the boundary pads 210 will be exemplarily described, for concise description.

The lower insulating structure 120 may be formed on the top surface of the semiconductor substrate 100 to cover the center pad 110 and the boundary pad 210. Each of the lower insulating structure 120 may be formed to have the first thickness T1. As an example, the first thickness T1 may range from 1 μm to 12 μm.

The formation of the lower insulating structure 120 may include sequentially forming the first lower insulating layer 120a, the second lower insulating layer 120b, and the third lower insulating layer 120c on the chip region CH and the boundary region SL. For example, the first lower insulating layer 120a may be formed of or include a silicon oxide layer, the second lower insulating layer 120b may be formed of or include a silicon nitride layer, and the third lower insulating layer 120c may be formed of or include a silicon oxide layer. In one embodiment, each of the first to third lower insulating layers 120a, 120b, and 120c may be formed by an atomic layer deposition (ALD) process or a chemical vapor deposition (CVD) process.

Referring to FIGS. 2, 5, 7A, and 7B, the first lower insulating structure 120 may be patterned to form the contact hole 125 exposing the center pad 110. Though one example contact hole 125 is shown, a plurality of contact holes may be formed at the same time for a plurality of center pads 110. The patterning of the lower insulating structure 120 may include forming a first photoresist pattern (not shown) to define an opening vertically overlapped with the center pad 110 and etching the lower insulating structure 120 using the first photoresist pattern as an etch mask. The first photoresist pattern may be formed to cover the lower insulating structure 120 of the boundary region SL, and thus, the lower insulating structure 120 of the boundary region SL may remain after the etching process. The first contact hole 125 may have the fourth width W4. For example, the fourth width W4 may range from 5 μm to 50 μm.

Referring to FIGS. 2, 5, 8A, and 8B, a barrier layer 132 may be formed on the lower insulating structure 120 and a conductive layer 134 may be formed on the barrier layer 132. The barrier layer 132 and the conductive layer 134 may be formed to fill at least a portion of the first contact hole 125. For example, the barrier layer 132 may be formed to directly cover the center pad 110 (e.g., to cover and be in contact with the center pad 110). The conductive layer 134 may be formed to have a thickness that is smaller than half a width of the first contact hole 125 provided with the barrier layer 132, and thereby to define the recess region 137 on or in the first contact hole 125. On the boundary region SL, the barrier layer 132 may be spaced apart from the boundary pad 210 with the lower insulating structure 120 interposed therebetween.

The barrier layer 132 and the conductive layer 134 may be formed in some embodiments by a physical vapor deposition (PVD) process. When measured in a direction perpendicular to the top surface of the semiconductor substrate 100, the conductive layer 134 in the first contact hole 125 may be formed to have the second thickness T2. The conductive layer 134 in the first contact hole 125 may be formed to have the fifth thickness T5, when measured in the first direction D1 or the second direction D2. In the case where the conductive layer 134 is formed by a PVD process with a low step coverage property, the second thickness T2 may be greater than the fifth thickness T5.

In some embodiments, the barrier layer 132 may be formed of a metallic material containing at least one of Ti, TiN, Ta, or TaN. The conductive layer 134 may be formed, for example, of a metallic material containing aluminum.

Referring to FIGS. 2, 5, 9A, and 9B, a second photoresist pattern PR may be formed on the conductive layer 134. In some embodiments, a plurality of second photoresist patterns PR may be formed to define positions and shapes of the redistribution layers 130 described with reference to FIGS. 2 and 3. In one embodiment, the second photoresist pattern PR may be formed to completely expose the conductive layer 134 on the boundary region SL.

The conductive layer 134 and the barrier layer 132 may be sequentially etched using the second photoresist pattern PR as an etch mask to form the redistribution layer 130. The redistribution layer 130 may include the first barrier pattern 133 and the first conductive pattern 135 on the first barrier pattern 133. The first conductive pattern 135 may include the contact portion 135a, the conductive line portion 135b, and the bonding pad portion 135c. The conductive layer 134 and the barrier layer 132 exposed by the second photoresist pattern PR may be completely removed to allow the lower insulating structure 120 to have exposed top surfaces.

The etching process of the conductive layer 134 and the barrier layer 132 may be performed, for example, using a dry etching process. As an example, an etching gas containing $BCl_3$ and/or $SF_6$ may be used for the dry etching process, but the inventive concept is not limited thereto.

In the case where the second photoresist pattern PR is used as a common mask for forming the first conductive pattern 135 and the first barrier pattern 133, the first conductive pattern 135 and the first barrier pattern 133 may overlap each other, when viewed in a plan view. For example, the first sidewall SW1 of the contact portion 135a may be vertically aligned with the second sidewall SW2 of the first barrier pattern 133 adjacent to the contact portion 135a. The third sidewall SW3 of the bonding pad portion 135c may be vertically aligned with the fourth sidewall SW4 of the first barrier pattern 133 adjacent to the bonding pad portion 135c.

Referring to FIGS. 2, 5, 10A, and 10B, the second photoresist pattern PR may be selectively removed. Thereafter, the upper insulating structure 140 may be formed on the redistribution layer 130 and the lower insulating structure 120.

For example, the formation of the upper insulating structure 140 may include sequentially forming the upper insulating layer 140a and the polymer layer 140b on the semiconductor substrate 100. On the chip region CH, the upper insulating layer 140a may be formed to directly cover the side and top surfaces of the redistribution layer 130. On the boundary region SL, the upper insulating layer 140a may be formed to directly cover the top surface of the third lower insulating layer 120c.

The upper insulating layer 140a may be formed, for example, by an atomic layer deposition (ALD) process or a chemical vapor deposition (CVD) process. The polymer layer 140b may be formed by coating a polymer material (e.g., at least one of polyimide, fluoro carbon, resin, or synthetic rubber) or a precursor thereof on the upper insulating layer 140a. The upper insulating layer 140a may be formed to have the third thickness T3, and the polymer layer 140b may be formed to have the fourth thickness T4. Here, the fourth thickness T4 (e.g., in a vertical direction) may be greater than the third thickness T3 (e.g., in the vertical direction).

Referring to FIGS. 2, 5, 11A, and 11B, the upper insulating structure 140 may be patterned to form the first opening 145 exposing the bonding pad portion 135c and the second opening 245 vertically overlapping the boundary pad 210. The patterning of the upper insulating structure 140 may include forming a third photoresist pattern (not shown) and etching the upper insulating structure 140 using the third photoresist pattern as an etch mask, where the third photoresist pattern is formed to define openings that respectively overlap the bonding pad portion 135c and the boundary pad 210. The first opening 145 may be formed to have the third width W3 (e.g., in a horizontal direction D1 or D2). For example, the third width W3 may range from 100 µm to 300 µm. In a subsequent package process, a wire bonding process may be performed on the bonding pad portion 135c exposed by the first opening 145. As such, the bonding pad portion 135c may function as a bonding pad, and may be referred to herein as a bonding pad.

Next, the lower insulating structure 120 exposed by the second opening 245 may be etched to expose the boundary pad 210 to the outside. For example, the second opening 245 may be formed to penetrate not only the upper insulating structure 140 but also the lower insulating structure 120, and thus, the boundary pad 210 may be exposed to the outside through the second opening 245. The etching of the lower insulating structure 120 may be performed using the third photoresist pattern or the patterned upper insulating structure 140 as an etch mask.

Although not shown in the drawings, a method of fabricating a semiconductor chip may include electrically testing the semiconductor chip. In such a testing step, a test probe may be used to contact the boundary pad 210, which is exposed by the second opening 245, and this contact may make it possible to allow test signals to be applied to the boundary metal layers and/or the boundary transistors and consequently to detect whether there is a failure of the semiconductor chip. In some embodiments, the boundary metal layers may be formed at the same time as the metal layers M1-M3 of the first integrated circuit IC1 and the boundary transistors may be formed at the same time as the transistors TR of the first integrated circuit IC1 (e.g., as part of the same step or set of steps). Accordingly, in the case where the boundary metal layers and/or the boundary transistors are electrically tested using the boundary pad 210, it is possible to know whether a process failure (e.g., a contact failure) occurs in the metal layers M1-M3 or the transistors TR of the first integrated circuit IC1. In certain embodiments, the boundary pads 210 as well as their associated metal layers and/or boundary transistors (referred to herein collectively as boundary circuits 210, or scribe region circuits 210) are not electrically connected to any of the circuitry of the first integrated circuit IC1 (e.g., they are not connected to transmit electrical signals to or from the various elements of the first integrated circuit IC1).

Referring back to FIGS. 2, 3A, and 3B, the semiconductor substrate 100 may be cut along the boundary region SL. As a result, the plurality of first semiconductor chips 20 shown in FIG. 5 may be separated from each other. After the cutting step, each of the first semiconductor chips 20 may be mounted on the package substrate 10 described with reference to FIG. 1.

Referring back to FIG. 11B, the semiconductor substrate 100 may be cut along a cutting line CT. The cutting line CT may be selected to cross the boundary pad 210. In this case, the fifth sidewall SW5 of the boundary pad 210 may be aligned with the sixth sidewall SW6 of the semiconductor substrate 100. The cutting at the boundary region may also include cutting one of more of the circuits below the boundary pad 210—such as cutting through one or more transistors of the boundary region SL beneath the boundary pad 210, cutting between two transistors of the boundary region SL beneath the boundary pad 210, and/or cutting through one or more metal layers of the boundary region SL beneath the boundary pad 210. As a result of the cutting, in certain embodiments, the boundary pad 210 may be cut in half. In embodiments where the boundary pad 210 is the same size as the center pad 110, after cutting, the boundary pad 210 may be half the size of the center pad 110.

According to some embodiments of the inventive concept, the redistribution layer 130 may be formed by a deposition and patterning process, not by a plating process. Accordingly, the redistribution layer 130 may be formed of an inexpensive metal (e.g., aluminum), instead of gold or copper, and thus, it is possible to reduce production cost in a process of fabricating a semiconductor chip and package. In some embodiments, for example, the redistribution layer 130 includes aluminum and does not include gold or copper (e.g., it may include only aluminum). In addition, it is possible to utilize an existing metal-patterning system for the process of patterning the redistribution layer 130 and thereby to improve efficiency in the fabrication process.

In addition, according to some embodiments of the inventive concept, a thick metal layer (e.g., a redistribution pad 230 to be described below) may not be provided on the boundary region SL. Accordingly, it is possible to prevent the above technical issues (e.g., damage of the cutting blade and a crack of the substrate), which may occur during the cutting process.

Figure 12:
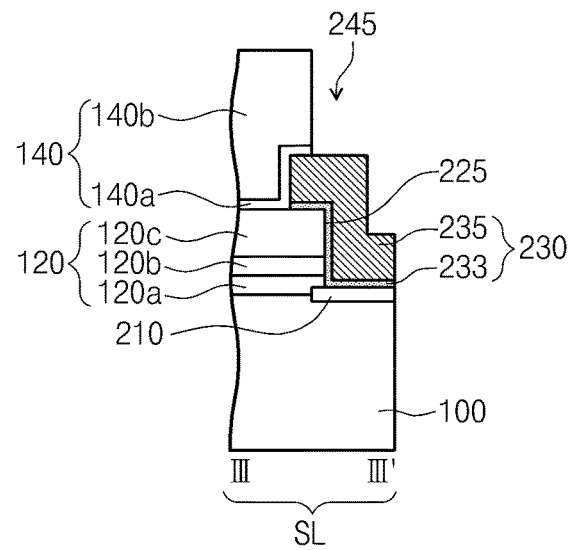
FIG. 12 is a sectional view taken along line III-III' of FIG. 2 and illustrates a first semiconductor chip according to some embodiments of the inventive concept.
Figure 13:
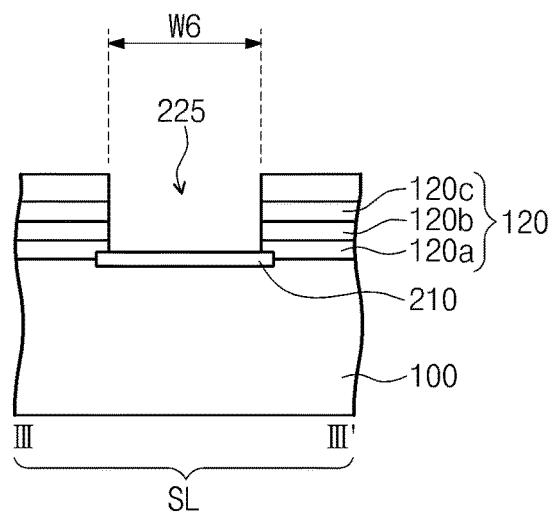
FIGS. 13 through 17 are sectional views taken along line III-III' of FIG. 2 to illustrate a method of fabricating a first semiconductor chip, according to some embodiments of the inventive concept.
Figure 14:
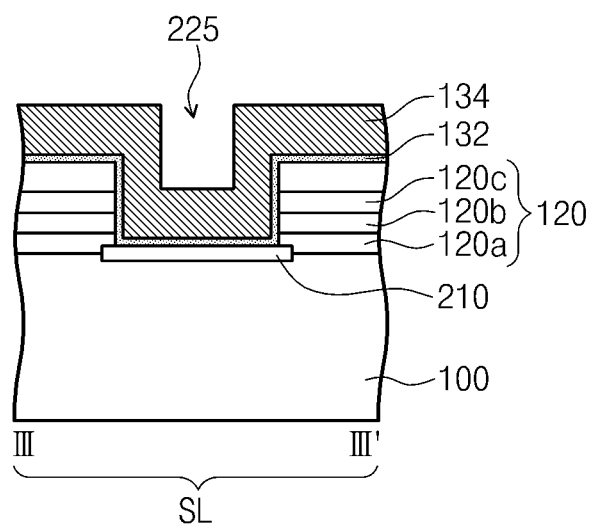
Figure 15:
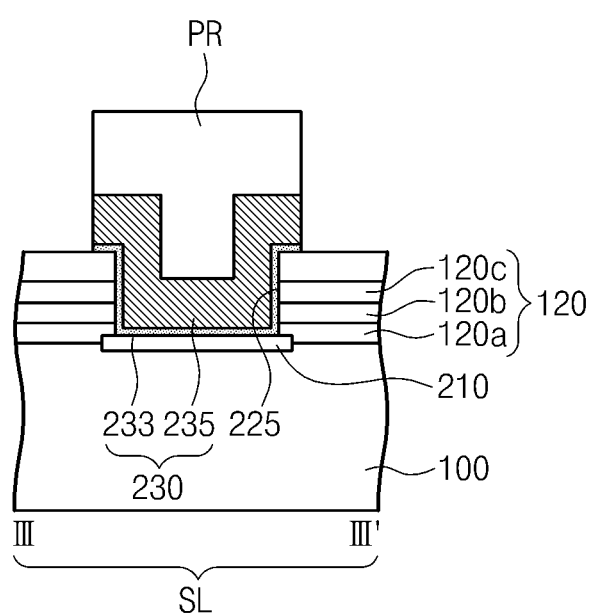
Figure 16:
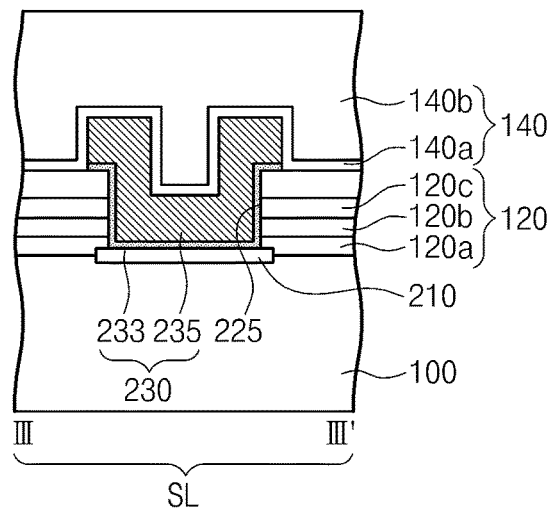
Figure 17:
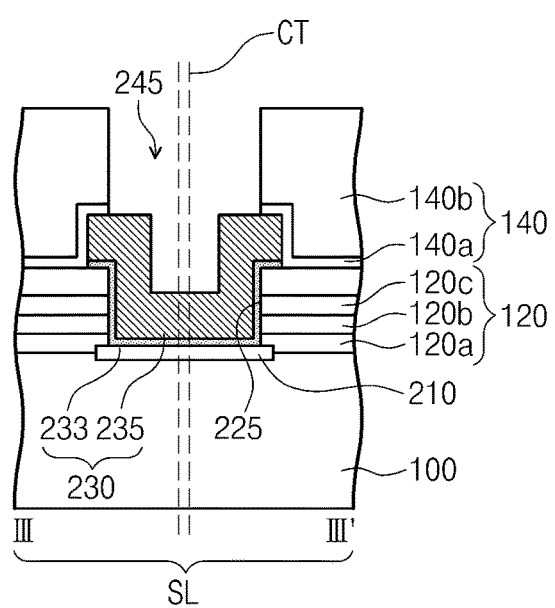

FIG. 12 is a sectional view taken along line III-III' of FIG. 2 and illustrates a first semiconductor chip according to some embodiments of the inventive concept. In the following description, an element of the first semiconductor chip previously described with reference to FIGS. 2, 3A, 3B, and 4 may be identified by a similar or identical reference number without repeating an overlapping description thereof, for the sake of brevity.

Referring to FIGS. 2, 3A, and 12, a second contact hole 225 may be provided to penetrate the lower insulating structure 120 and expose a portion of the boundary pad 210. On the lower insulating structure 120 of the boundary region SL, the redistribution pad 230 may be provided to fill at least a portion of the second contact hole 225 and to be electrically connected to the boundary pad 210. In some embodiments, a plurality of redistribution pads 230 may be provided on the boundary pads 210, respectively.

The redistribution pad 230 may include a second barrier pattern 233 and a second conductive pattern 235 on the second barrier pattern 233. The second barrier pattern 233 may be interposed between the lower insulating structure 120 and the second conductive pattern 235. The second barrier pattern 233 may be overlapped with the second conductive pattern 235, when viewed in a plan view. The second conductive pattern 235 and the first conductive pattern 135 may be formed of the same material, and the second barrier pattern 233 and the first barrier pattern 133 may be formed of the same material.

The second opening 245 may be provided to penetrate the upper insulating structure 140 and expose the redistribution pad 230. For example, referring back to FIG. 2, a plurality of second openings 245 may be provided on the boundary region SL to expose the second conductive patterns 235, respectively.

FIGS. 13 through 17 are sectional views taken along line III-III' of FIG. 2 to illustrate a method of fabricating a first semiconductor chip, according to some embodiments of the inventive concept. For concise description, an element or step previously described with reference to FIGS. 2, 5, 6A to 11A, and 6B to 11B may be identified by a similar or identical reference number without repeating an overlapping description thereof.

Figure 6A:
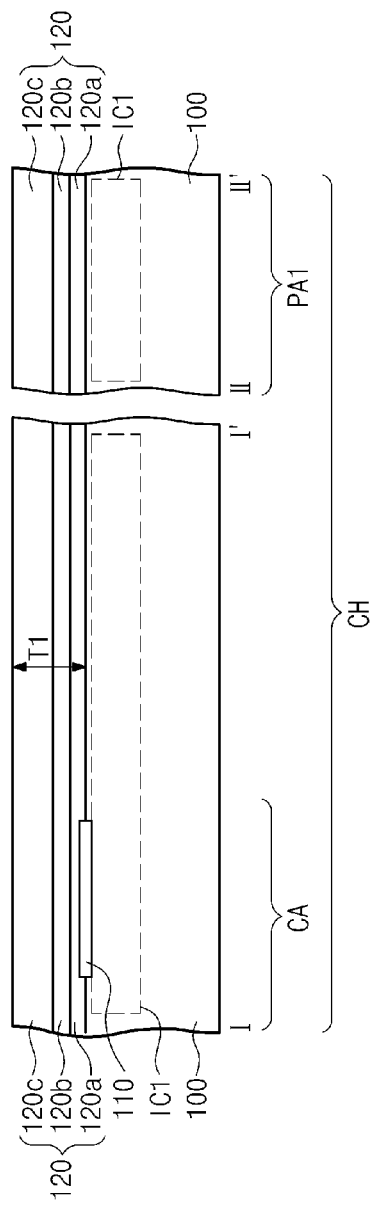
Figure 6B:
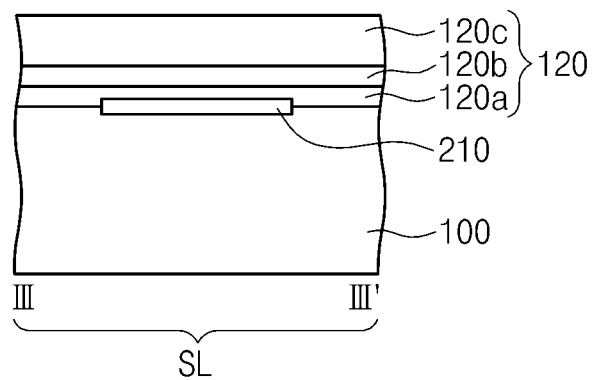
Figure 7B:
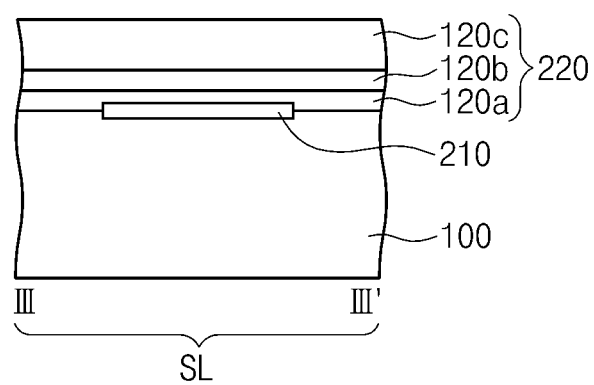
Figure 8B:
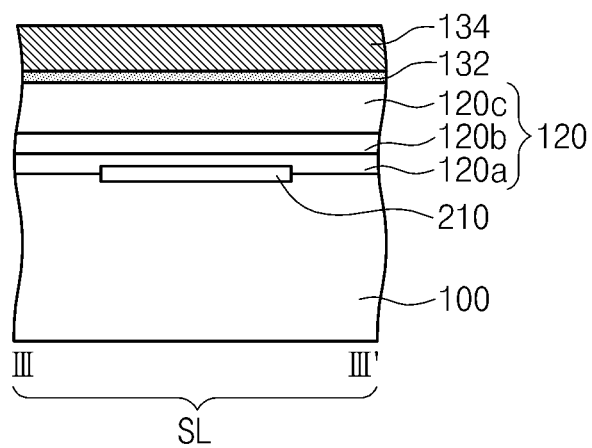
Figure 9A:
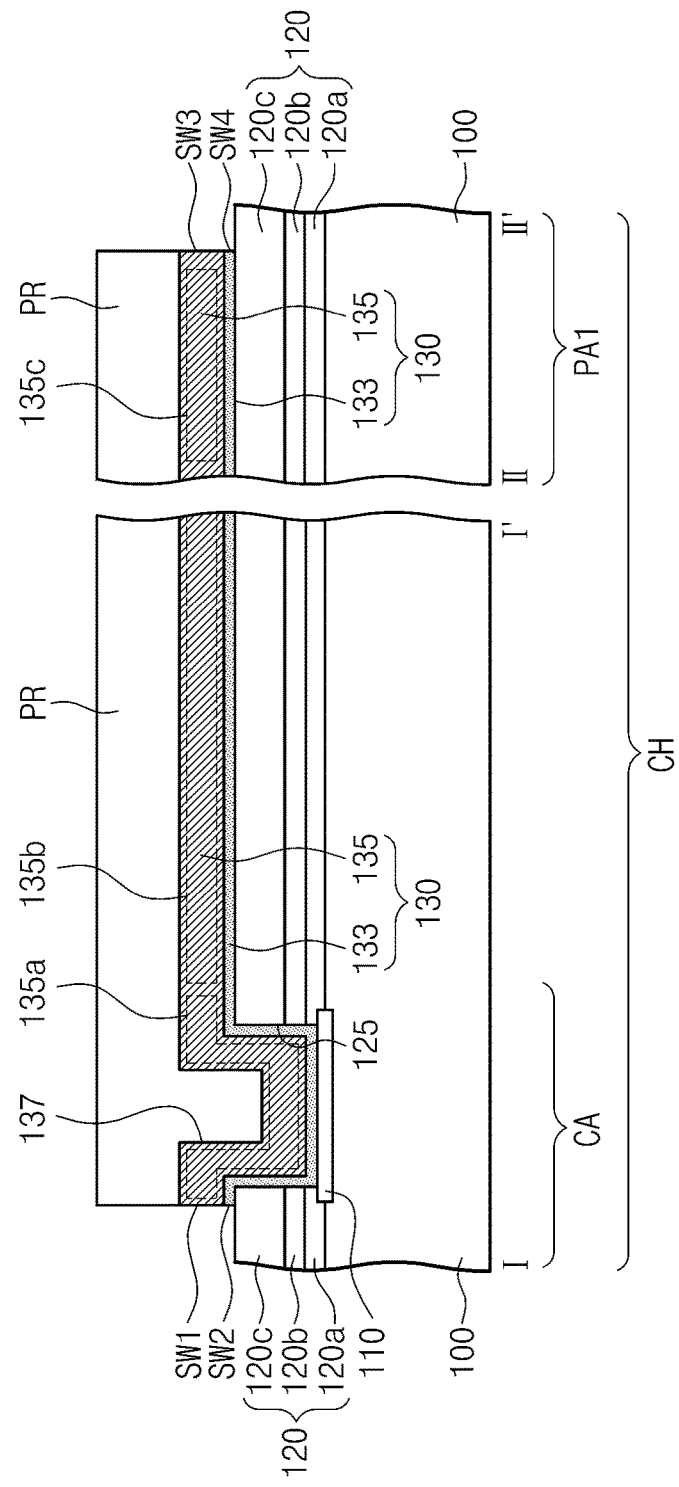
Figure 9B:
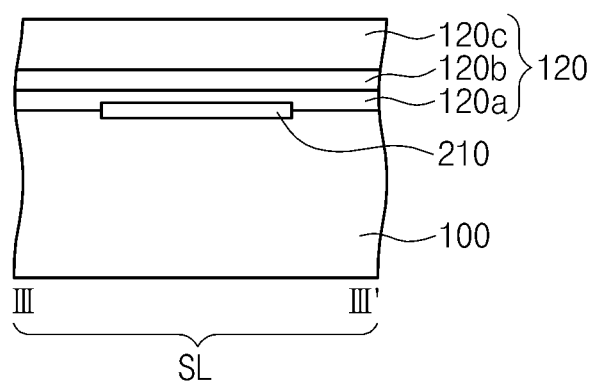
Figure 10A:
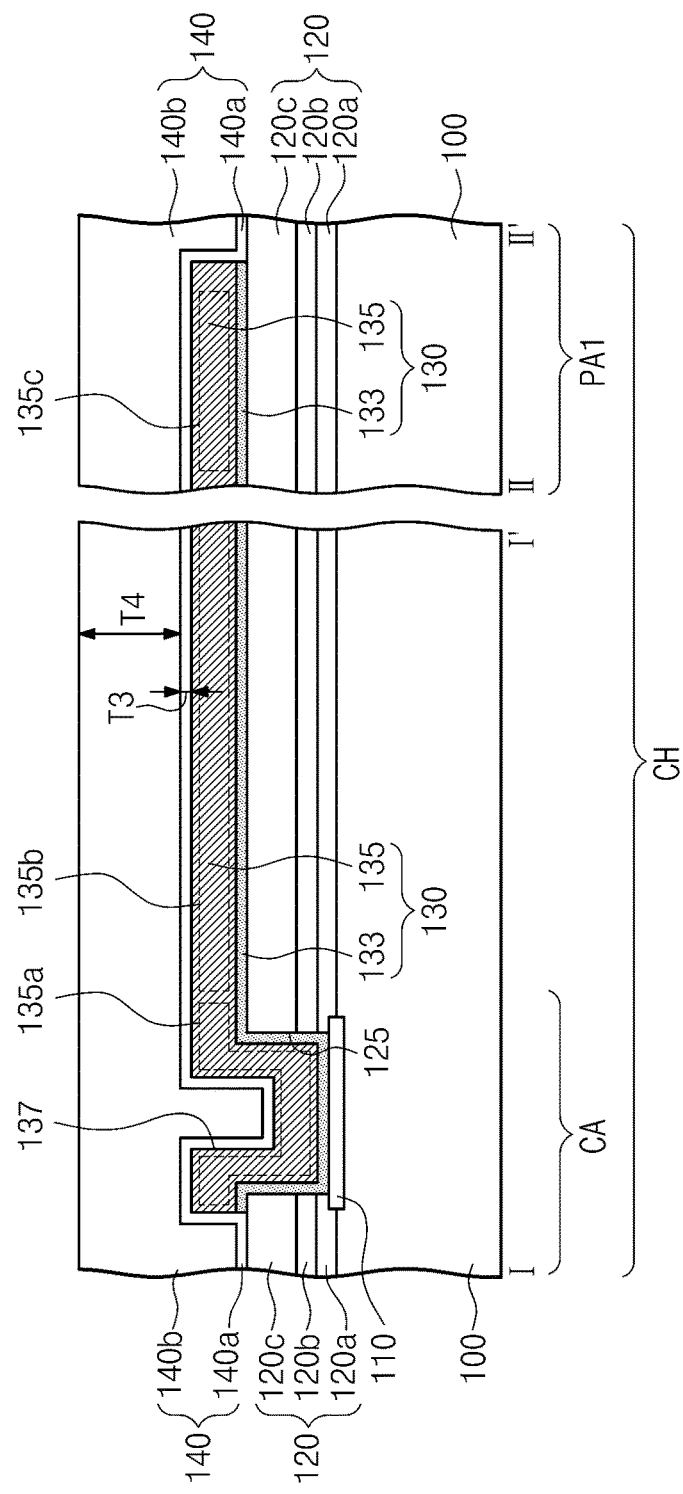
Figure 10B:
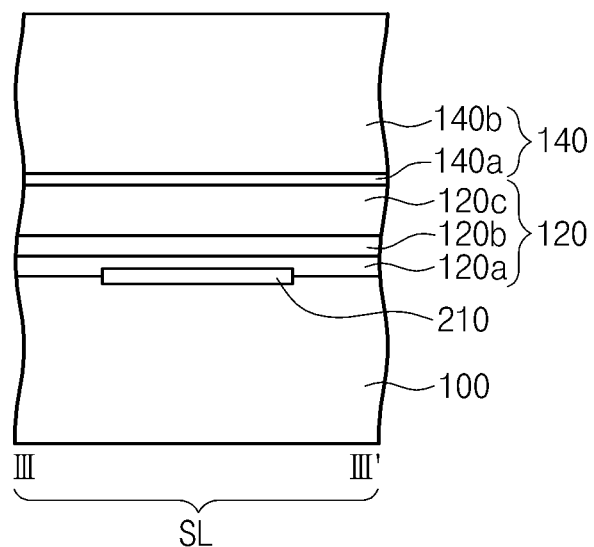
Figure 11A:
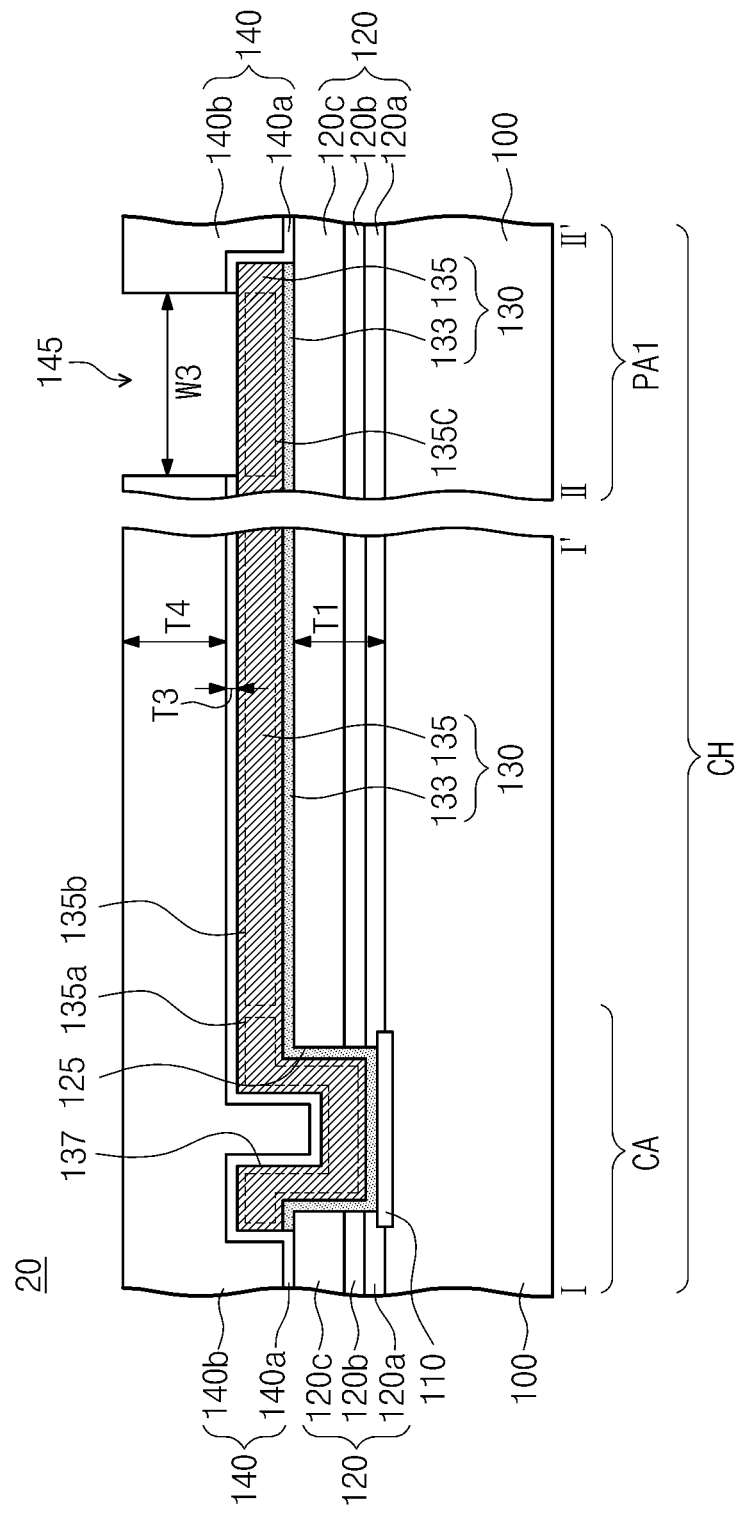
Figure 11B:
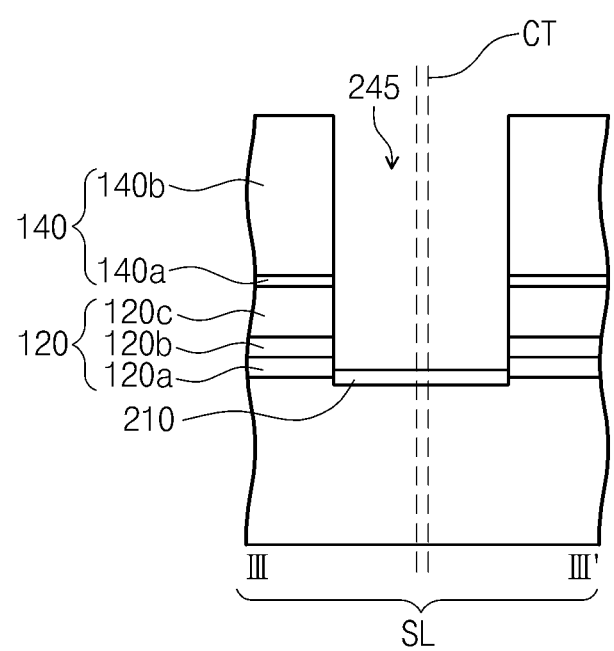

Referring to FIGS. 2, 5, 7A, and 13, the first contact hole 125 and the second contact hole 225 may be formed on the structure of FIGS. 6A and 6B. The second contact hole 225 may be formed at the same time when the first contact hole 125 is formed (e.g., as part of the same patterning process). For example, the lower insulating structure 120 may be patterned using a first photoresist pattern (not shown) as a common etch mask to form the first and second contact holes 125 and 225.

The second contact hole 225 may be formed to expose the boundary pad 210 of the boundary region SL. The second contact hole 225 may be formed to have the sixth width W6. In some embodiments, the sixth width W6 may be substantially equal to the fourth width W4 of the first contact hole 125. For example, the sixth width W6 may range from 5 µm to 50 µm.

Referring to FIGS. 2, 5, 8A, and 14, the barrier layer 132 may be formed on the lower insulating structure 120 and the conductive layer 134 may be formed on the barrier layer 132. The barrier layer 132 and the conductive layer 134 may be formed to fill not only the first contact hole 125 but also the second contact hole 225. Accordingly, the barrier layer 132 may directly cover the boundary pad 210.

Similar to the conductive layer 134 in the first contact hole, a thickness of the conductive layer 134 in the second contact hole 225 may be formed to have a difference, when measured in both directions perpendicular and parallel to the top surface of the semiconductor substrate 100.

Referring to FIGS. 2, 5, 9A, and 15, the conductive layer 134 and the barrier layer 132 may be sequentially patterned using the second photoresist pattern PR as an etch mask to form the redistribution layer 130 and the redistribution pad 230 on the chip region CH and the boundary region SL, respectively. Unlike the method described with reference to FIG. 9B, the second photoresist pattern PR may also be formed on the boundary region SL. The redistribution pad 230 may be formed to include the second barrier pattern 233 and the second conductive pattern 235 on the second barrier pattern 233.

Referring to FIGS. 2, 5, 10A, and 16, the second photoresist pattern PR may be selectively removed. Thereafter, the upper insulating structure 140 may be formed on the redistribution layer 130, the redistribution pad 230, and the lower insulating structure 120.

Referring to FIGS. 2, 5, 11A, and 17, the upper insulating structure 140 may be patterned to form the first opening 145 exposing the bonding pad portion 135c and the second opening 245 exposing the second conductive pattern 235. Unlike the method described with reference to FIG. 11B, the lower insulating structure 120 of the boundary region SL may not be etched after patterning of the redistribution layer 130, since it was etched previously.

Although not shown in the drawings, a method of fabricating a semiconductor chip may include electrically testing the semiconductor chip. In such a testing step, a test probe may be used to contact the redistribution pad 230 exposed by the second opening 245, and test signals may be applied to boundary metal layers and/or boundary transistors, which are disposed below the boundary pad 210.

Referring back to FIGS. 2, 3A, and 12, the semiconductor substrate 100 may be cut along the boundary region SL. As a result, the plurality of first semiconductor chips 20 shown in FIG. 5 may be separated from each other, for example by performing a cutting operation at the boundary region SL. The cutting at the boundary region may also include cutting one of more of the circuits below the boundary pad 210—such as cutting through one or more transistors of the boundary region SL beneath the boundary pad 210, cutting between two transistors of the boundary region SL beneath the boundary pad 210, and/or cutting through one or more metal layers of the boundary region SL beneath the boundary pad 210. After the cutting step, each of the first semiconductor chips 20 may be mounted on the package substrate 10 described with reference to FIG. 1.

According to some embodiments of the inventive concept, it is possible to apply the same fabrication process on not only the chip region CH but also the boundary region SL, without addition of a process step. For example, the redistribution pad 230 electrically connected to the boundary pad 210 may be automatically formed during the formation of the redistribution layer 130, and this may make it possible to improve efficiency of the fabrication process. In addition, the redistribution pad 230 may be exposed by a method of etching only the upper insulating structure 140, and thus, it is possible to reduce a process time for the etching process and a technical difficulty in the process.

Figure 18:
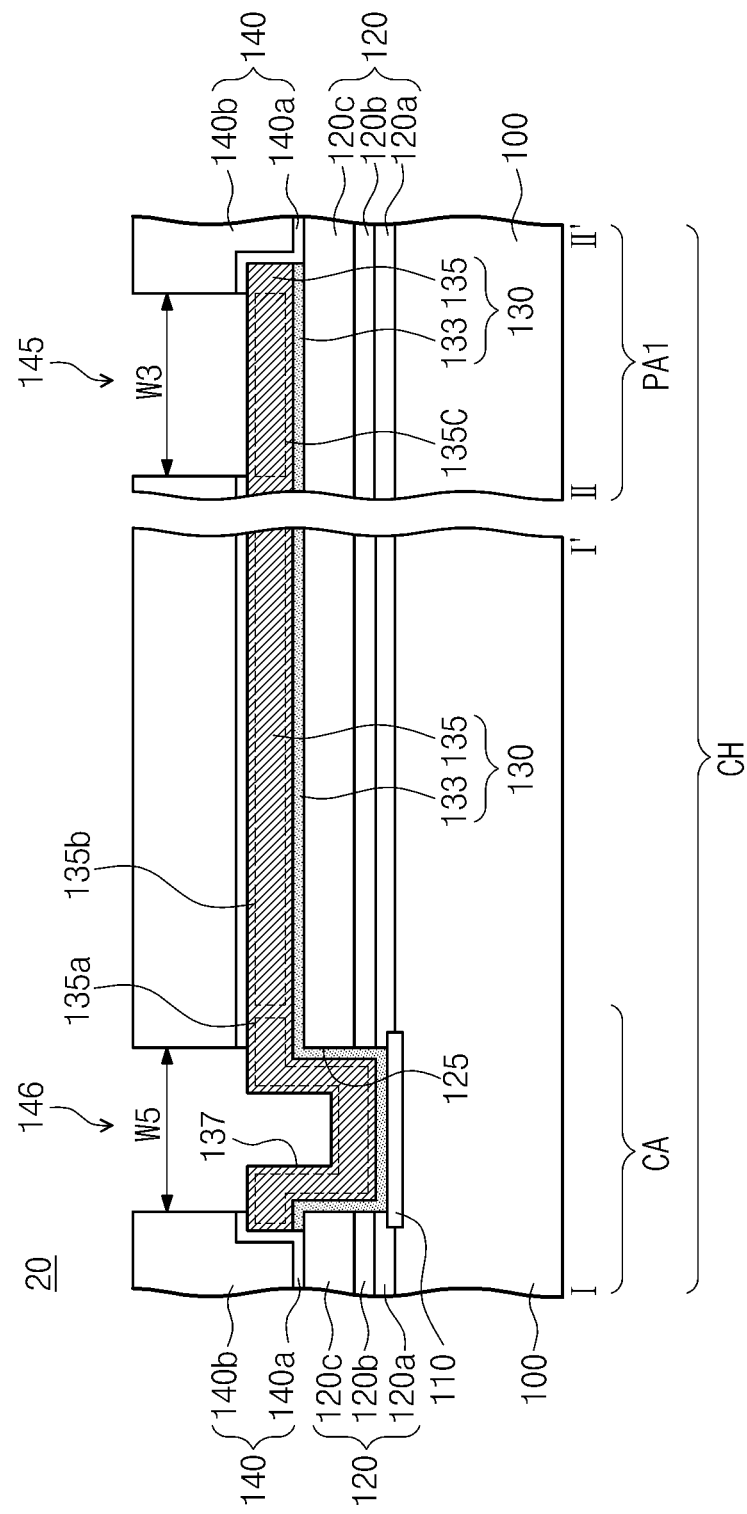
FIG. 18 is a sectional view of sections, which are respectively taken along lines I-I' and II-II' of FIG. 2, and illustrates a first semiconductor chip according to some embodiments of the inventive concept.

FIG. 18 is a sectional view of sections, which are respectively taken along lines I-I' and II-II' of FIG. 2, and illustrates a first semiconductor chip according to some embodiments of the inventive concept. In the following description, an element of the first semiconductor chip previously described with reference to FIGS. 2, 3A, 3B, and 4 may be identified by a similar or identical reference number without repeating an overlapping description thereof, for the sake of brevity.

Referring to FIGS. 2, 3B, and 18, a third opening 146 may be provided to penetrate the upper insulating structure 140 and to expose the contact portion 135a. The third opening 146 may be provided to have a fifth width W5. In some embodiments, the fifth width W5 may range from 10 μm to 100 μm.

Although not shown, an additional outer terminal may be connected to the contact portion 135a through the third opening 146. Accordingly, this structure of the contact portion 135a, in conjunction with the bonding pad portion 135c exposed by the first opening 145, may make it possible to increase a degree of freedom in establishing a routing path with an external controller (not shown).

Figure 19B:
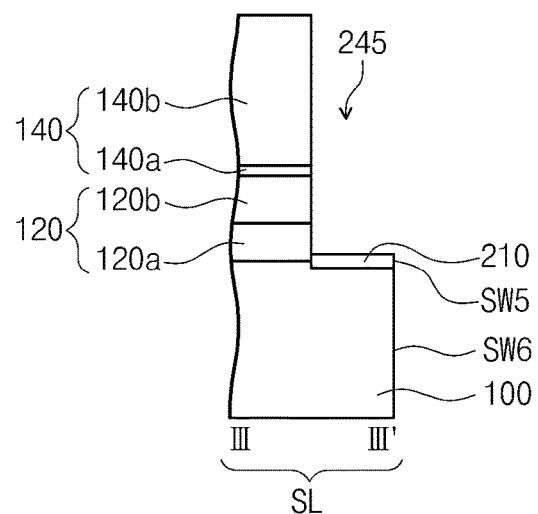
FIG. 19B is a sectional view taken along line III-III' of FIG. 2 and illustrates the first semiconductor chip according to some embodiments of the inventive concept.

FIG. 19A is a sectional view of sections, which are respectively taken along lines I-I' and II-II' of FIG. 2, and illustrates a first semiconductor chip according to some embodiments of the inventive concept. FIG. 19B is a sectional view taken along line III-III' of FIG. 2 and illustrates the first semiconductor chip according to some embodiments of the inventive concept. In the following description, an element of the first semiconductor chip previously described with reference to FIGS. 2, 3A, 3B, and 4 may be identified by a similar or identical reference number without repeating an overlapping description thereof, for the sake of brevity.

Referring to FIGS. 2, 19A, and 19B, the lower insulating structure 120 may include the first and second lower insulating layers 120a and 120b, which may be sequentially stacked on the semiconductor substrate 100. Each or at least one of the first and second lower insulating layers 120a and 120b may be formed of or include an inorganic insulating layer (e.g., of silicon nitride, silicon oxide, or silicon oxynitride). For example, the first lower insulating layer 120a may be formed of or include a silicon nitride layer, and the second lower insulating layer 120b may be formed of or include a silicon oxide layer.

Figure 20:
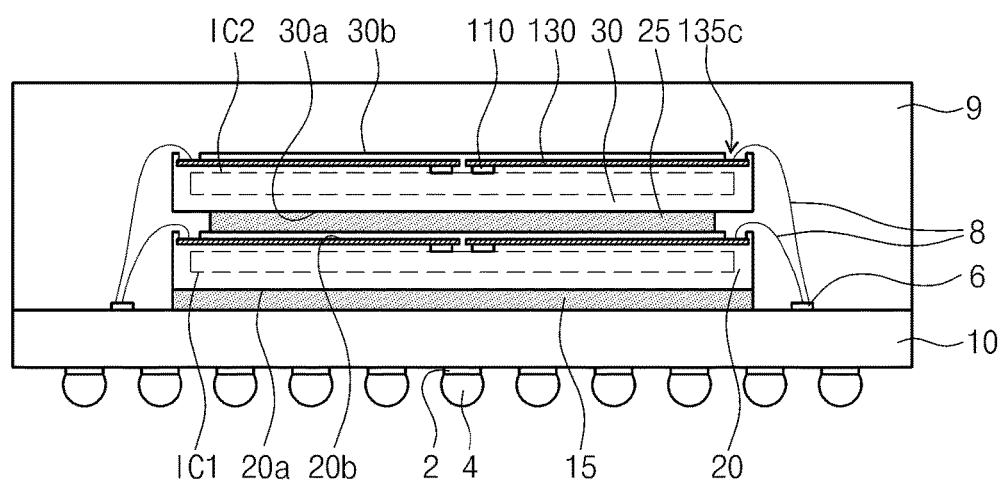
FIG. 20 is a sectional view illustrating a semiconductor package according to some embodiments of the inventive concept.

FIG. 20 is a sectional view illustrating a semiconductor package according to some embodiments of the inventive concept. In the following description, an element of the semiconductor package previously described with reference to FIGS. 1 and 2 may be identified by a similar or identical reference number without repeating an overlapping description thereof, for the sake of brevity.

Referring to FIG. 20, the first semiconductor chip 20 may be mounted on the package substrate 10, and a second semiconductor chip 30 may be mounted on the first semiconductor chip 20. The second semiconductor chip 30 may have a third surface 30a facing the first semiconductor chip 20 and a fourth surface 30b opposite to the third surface 30a.

The second semiconductor chip 30 may be a chip that is the same as or similar to the first semiconductor chip 20. For example, the second semiconductor chip 30 may be configured to have a second integrated circuit IC2, in addition to the center pads 110 and the redistribution layers 130. The redistribution layers 130 may include the bonding pad portions 135c. In some embodiments, the second semiconductor chip 30 may be one of memory chips (e.g., DRAM chips or FLASH memory chips). The second integrated circuit IC2 may include memory cells for storing data and a control and/or power circuit for controlling operations of the memory cells.

The second semiconductor chip 30 may be attached to the first semiconductor chip 20 using the second adhesive layer 25. The second adhesive layer 25 may be an insulating layer or tape (e.g., containing an epoxy or silicone-based material). The second adhesive layer 25 may have a top surface positioned at a higher level than the topmost level of the wires 8 connected to the first semiconductor chip 20.

The wires 8 may be provided to respectively connect the bonding pad portions 135c of the second semiconductor chip 30 to the second outer pads 6 of the package substrate 10. The second semiconductor chip 30 may communicate with an external controller (not shown) through the wires 8.

The mold layer 9 may be provided on the package substrate 10 to cover the first and second semiconductor chips 20 and 30 and the wires 8. The mold layer 9 may be configured to protect the first and second semiconductor chips 20 and 30 and the wires 8 against external environment.

In some embodiments, the semiconductor package may further include at least one semiconductor chip disposed on the second semiconductor chip 30, in addition to the first and second semiconductor chips 20 and 30.

Figure 21A:
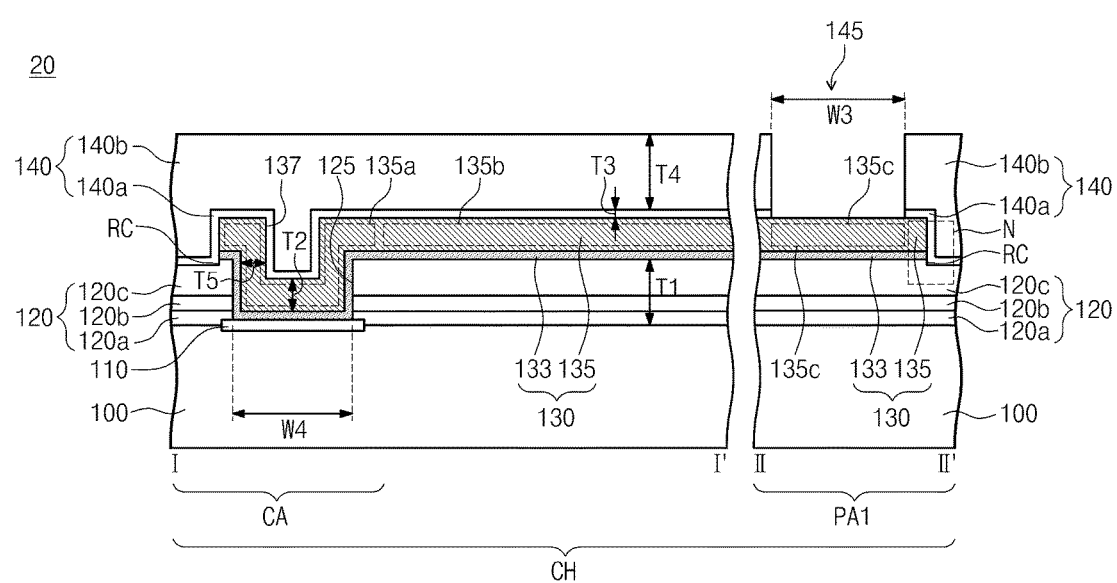
FIG. 21A is a sectional view of sections, which are respectively taken along lines I-I' and II-II' of FIG. 2.
Figure 21B:
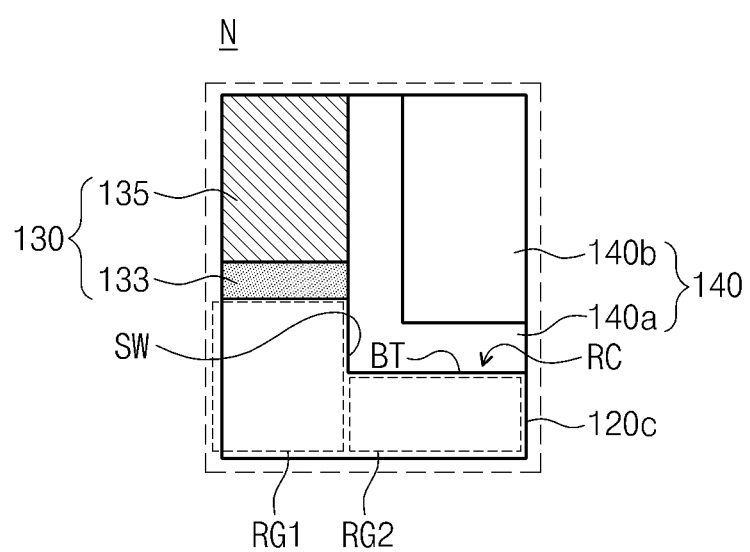
FIG. 21B is an enlarged sectional view of a region N of FIG. 21A.

FIG. 21A is a sectional view of sections, which are respectively taken along lines I-I' and II-II' of FIG. 2, and illustrates a first semiconductor chip according to some embodiments of the inventive concept. FIG. 21B is an enlarged sectional view of a region N of FIG. 21A. In the following description, an element of the first semiconductor chip previously described with reference to FIGS. 2, 3A, and 3B may be identified by a similar or identical reference number without repeating an overlapping description thereof, for the sake of brevity.

Referring to FIGS. 2, 3B, 21A, and 21B, the third lower insulating layer 120c may be provided to define a recess region RC. The recess region RC may be formed on the chip region CH. Although not shown, the recess region RC may be formed on the boundary region SL. When viewed in a plan view, the recess region RC may be spaced apart from the redistribution layer 130. For example, the recess region RC may not overlap the redistribution layer 130, when viewed in a plan view.

Referring back to FIG. 21B, the recess region RC may have a bottom surface BT, which is positioned at a lower level than that of a top surface of the third lower layer 120c provided under the redistribution layer 130. The first upper insulating layer 140a may be provided to directly cover a sidewall SW and the bottom surface BT of the recess region RC.

For example, the first lower insulating structure 120 may include a first region RG1 and a second region RG2. When viewed in a plan view, the first region RG1 may overlap the redistribution layer 130, and the second region RG2 may overlap the recess region RC. Here, a top surface of the first region RG1 may be higher than a top surface of the second region RG2 (e.g., the bottom surface BT of the recess region RC).

Referring back to FIGS. 2, 5, 9A, 9B, 21A, and 21B, an upper portion of the first lower insulating structure 120 may be etched during the process of etching the first conductive layer 134 and the first barrier layer 132. For example, during the etching process, the first conductive layer 134 and the first barrier layer 132 exposed by the second photoresist pattern PR may be removed, and then, an upper portion of the third lower insulating layer 120c thereunder may be partially etched. As a result, during the process of etching the redistribution layer 130, the recess region RC may be formed in the third lower insulating layer 120c.

According to some embodiments of the inventive concept, a semiconductor chip may include a redistribution layer formed by a deposition and patterning process. The use of the deposition and patterning process may make it possible to provide an insulating structure and/or a redistribution pad on a scribe lane region of the semiconductor chip.

According to some embodiments of the inventive concept, it is possible to prevent technical issues (e.g., damage of the cutting blade and a crack of the substrate) from occurring in a cutting process. Furthermore, since in some embodiments, the redistribution pad is automatically formed, it is possible to improve efficiency and reduce a technical difficulty in a process of fabricating a semiconductor chip.

While example embodiments of the inventive concepts have been particularly shown and described, it will be understood by one of ordinary skill in the art that variations in form and detail may be made therein without departing from the spirit and scope of the attached claims.

What is claimed is:

1. A semiconductor device, comprising:
    a semiconductor chip having a semiconductor chip substrate including a chip region and a scribe lane region, an integrated circuit being provided on the chip region;
    a center pad provided on the chip region and electrically connected to the integrated circuit;
    a boundary pad provided on the scribe lane region;
    a lower insulating structure provided on the chip region and the scribe lane region, the lower insulating structure having a first contact hole exposing the center pad;
    a first conductive pattern comprising a contact portion, a conductive line portion, and a bonding pad portion, the contact portion filling at least a portion of the first contact hole, the conductive line portion disposed on the lower insulating structure of the chip region to connect the contact portion to the bonding pad portion; and
    an upper insulating structure with a first opening and a second opening, the first opening exposing the bonding pad portion, the second opening vertically overlapping the boundary pad,
    wherein the lower insulating structure comprises a plurality of lower insulating layers, which are sequentially stacked on the semiconductor chip substrate, and each of which is a silicon-containing inorganic layer.

2. The semiconductor device of claim 1, wherein the second opening is formed to penetrate the lower insulating structure and to expose the boundary pad to an outside of the semiconductor chip.

3. The semiconductor device of claim 1, further comprising a second conductive pattern provided on the scribe lane region and electrically connected to the boundary pad,
    wherein the second conductive pattern is provided to fill at least a portion of a second contact hole, which is formed in the lower insulating structure to expose the boundary pad, and
    the second opening is provided to expose the second conductive pattern.

4. The semiconductor device of claim 3, wherein the first conductive pattern and the second conductive pattern are formed of the same material.

5. The semiconductor device of claim 1, wherein the lower insulating layers comprise:
    a first lower insulating layer adjacent to the center pad;
    a second lower insulating layer on the first lower insulating layer; and
    a third lower insulating layer on the second lower insulating layer,
    wherein the second lower insulating layer is interposed between the first and third lower insulating layers,
    wherein each of the first and third lower insulating layers comprises a silicon oxide layer, and
    the second lower insulating layer comprises a silicon nitride layer.

6. The semiconductor device of claim 1, wherein the lower insulating layers comprise:
    a first lower insulating layer adjacent to the center pad;
    a second lower insulating layer on the first lower insulating layer; and
    a third lower insulating layer on the second lower insulating layer, wherein the second lower insulating layer is interposed between the first and third lower insulating layers, and wherein the third lower insulating layer has a thickness greater than that of the first lower insulating layer, and the third lower insulating layer has a thickness greater than that of the second lower insulating layer.

7. The semiconductor device of claim 1, wherein the lower insulating layers comprise:
a first lower insulating layer adjacent to the center pad;
a second lower insulating layer on the first lower insulating layer; and
a third lower insulating layer on the second lower insulating layer, wherein the second lower insulating layer is interposed between the first and third lower insulating layers, and
wherein the integrated circuit includes at least one dynamic random access memory (DRAM) cell.

8. The semiconductor device of claim 1, wherein the upper insulating structure comprises an upper insulating layer covering the lower insulating structure and the first conductive pattern and a polymer layer on the upper insulating layer.

9. The semiconductor device of claim 1, wherein the contact portion has a first thickness in a direction perpendicular to a top surface of the semiconductor chip substrate and a second thickness in another direction parallel to the top surface of the semiconductor chip substrate, and
the first thickness is greater than the second thickness.

10. The semiconductor device of claim 1, wherein the upper insulating structure further comprises a third opening exposing the contact portion to an outside of the semiconductor chip.

11. The semiconductor device of claim 1, wherein the center pad is electrically connected to the integrated circuit through a plurality of metal layers and a plurality of vias.

12. The semiconductor device of claim 1, wherein, when viewed in a plan view, the center pad is provided on a center area of the chip region, and
the bonding pad portion is provided on a peripheral area of the chip region.

13. The semiconductor device of claim 1, wherein the boundary pad is a cut pad having a size smaller than the center pad.

14. The semiconductor device of claim 1, further comprising:
a package substrate on which the semiconductor chip is mounted; and
a wire connected to a pad on the package substrate, the wire passing over the scribe lane region including the boundary pad, and bonded to the bonding pad portion of the first conductive pattern.

15. The semiconductor device of claim 1, further comprising:
one or more transistors and one or more metal layers below the boundary pad in the scribe lane region, the one or more transistors and one or more metal layers not electrically connected to the integrated circuit.

16. The semiconductor device of claim 1, further comprising a barrier pattern interposed between the lower insulating structure and the first conductive pattern,
wherein the barrier pattern overlaps the first conductive pattern, when viewed in a plan view, and
wherein the barrier pattern comprises at least one of Ti, TiN, Ta, or TaN.

17. The semiconductor device of claim 8, wherein the upper insulating layer comprises a silicon nitride layer, a silicon oxide layer, or a silicon oxynitride layer.

18. The semiconductor device of claim 8, wherein the polymer layer comprises at least one of polyimide, fluoro carbon, resin, or synthetic rubber.

19. The semiconductor device of claim 1, wherein each of the lower insulating layers comprises one of a silicon nitride layer, a silicon oxide layer, or a silicon oxynitride layer.

20. The semiconductor device of claim 1, wherein the first conductive pattern is formed of an aluminum-containing material.

* * * * *